(12) United States Patent
Yamazaki et al.

(10) Patent No.: US 7,960,733 B2
(45) Date of Patent: Jun. 14, 2011

(54) ELECTRONICS DEVICE, SEMICONDUCTOR DEVICE, AND METHOD FOR MANUFACTURING THE SAME

(75) Inventors: Shunpei Yamazaki, Setagaya (JP); Masaharu Nagai, Atsugi (JP); Osamu Nakamura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 23 days.

(21) Appl. No.: 12/251,753

(22) Filed: Oct. 15, 2008

(65) Prior Publication Data

US 2009/0051286 A1      Feb. 26, 2009

Related U.S. Application Data

(62) Division of application No. 12/007,293, filed on Jan. 9, 2008, now Pat. No. 7,465,593, and a division of application No. 10/925,992, filed on Aug. 26, 2004, now Pat. No. 7,446,336.

(30) Foreign Application Priority Data

Aug. 29, 2003    (JP) ................. 2003-308135

(51) Int. Cl.
*H01L 29/04* (2006.01)
(52) U.S. Cl. ....... 257/59; 257/91; 257/99; 257/E33.056; 257/E33.059; 257/E33.06
(58) Field of Classification Search ......... 257/59, 257/91, 99, E33.056, E33.059, E33.06; 349/122, 349/138
See application file for complete search history.

(56) References Cited

U.S. PATENT DOCUMENTS

| | | |
|---|---|---|
| 5,882,761 A | 3/1999 | Kawami et al. |
| 6,515,310 B2 | 2/2003 | Yamazaki et al. |
| 6,717,181 B2 | 4/2004 | Murakami et al. |

(Continued)

FOREIGN PATENT DOCUMENTS

CN      1372331      10/2002

(Continued)

OTHER PUBLICATIONS

Office Action (Application No. 200410076977.8) dated Jun. 29, 2007.

(Continued)

*Primary Examiner* — Matthew E Warren
(74) *Attorney, Agent, or Firm* — Eric J. Robinson; Robinson Intellectual Property Law Office, P.C.

(57) ABSTRACT

It is an object of the present invention to provide a high reliable EL display device and a manufacturing method thereof by shielding intruding moisture or oxygen which is a factor of deteriorating the property of an EL element without enlarging the EL display device.

In the invention, application is used as a method for forming a high thermostability planarizing film 16, typically, an interlayer insulating film (a film which serves as a base film of a light emitting element later) of a TFT in which a skeletal structure is configured by the combination of silicon (Si) and oxygen (O). After the formation, an edge portion or an opening portion is formed to have a tapered shape. Afterwards, distortion is given by adding an inert element with a comparatively large atomic radius to modify or highly densify a surface (including a side surface) for preventing the intrusion of moisture or oxygen.

11 Claims, 12 Drawing Sheets

U.S. PATENT DOCUMENTS

| | | | |
|---|---|---|---|
| 6,724,150 B2 | 4/2004 | Maruyama et al. | |
| 6,822,264 B2 | 11/2004 | Yamazaki et al. | |
| 6,822,391 B2 | 11/2004 | Yamazaki et al. | |
| 6,825,071 B2* | 11/2004 | Suzawa et al. | 438/158 |
| 6,833,560 B2 | 12/2004 | Konuma et al. | |
| 6,858,878 B2 | 2/2005 | Yamazaki et al. | |
| 6,864,508 B2 | 3/2005 | Yamazaki et al. | |
| 6,864,943 B2 | 3/2005 | Hirakata et al. | |
| 6,956,325 B2 | 10/2005 | Yamazaki et al. | |
| 6,992,439 B2 | 1/2006 | Yamazaki et al. | |
| 7,019,718 B2 | 3/2006 | Yamazaki et al. | |
| 7,112,115 B1 | 9/2006 | Yamazaki et al. | |
| 7,122,835 B1 | 10/2006 | Ikeda et al. | |
| 7,129,523 B2 | 10/2006 | Yamazaki et al. | |
| 7,133,100 B2 | 11/2006 | Ahn | |
| 7,190,115 B2 | 3/2007 | Tsuchiya et al. | |
| 7,223,643 B2 | 5/2007 | Ohnuma et al. | |
| 7,226,806 B2 | 6/2007 | Sakayori et al. | |
| 7,264,979 B2 | 9/2007 | Yamagata et al. | |
| 7,271,411 B2 | 9/2007 | Koyama et al. | |
| 7,575,961 B2 | 8/2009 | Ikeda et al. | |
| 7,662,011 B2 | 2/2010 | Yamazaki et al. | |
| 7,679,092 B2 | 3/2010 | Yamazaki et al. | |
| 2003/0042849 A1 | 3/2003 | Ogino | |
| 2003/0222575 A1* | 12/2003 | Yamazaki et al. | 313/504 |
| 2004/0263740 A1 | 12/2004 | Sakakura et al. | |
| 2005/0045891 A1 | 3/2005 | Yamazaki et al. | |
| 2005/0046346 A1 | 3/2005 | Tsuchiya et al. | |
| 2005/0156519 A1 | 7/2005 | Yoshizawa et al. | |
| 2005/0184652 A1 | 8/2005 | Maruyama et al. | |
| 2005/0218396 A1 | 10/2005 | Tsuchiya et al. | |
| 2006/0006799 A1 | 1/2006 | Yamazaki et al. | |

FOREIGN PATENT DOCUMENTS

| | | |
|---|---|---|
| EP | 0 776 147 | 5/1997 |
| EP | 0 993 235 | 4/2000 |
| JP | 09-148066 | 6/1997 |
| JP | 10-335060 | 12/1998 |
| JP | 11-271753 | 10/1999 |
| JP | 2000-353811 | 12/2000 |
| JP | 2001-203076 | 7/2001 |
| JP | 2001-357973 | 12/2001 |
| JP | 2002-033185 | 1/2002 |
| JP | 2002-305076 | 10/2002 |
| JP | 2002-324666 | 11/2002 |
| JP | 2003-297552 | 10/2003 |

OTHER PUBLICATIONS

Miyashita et al., "Full Color Displays Fabricated by Ink-Jet Printing," Asia Display / IDW '01, pp. 1399-1402.

* cited by examiner

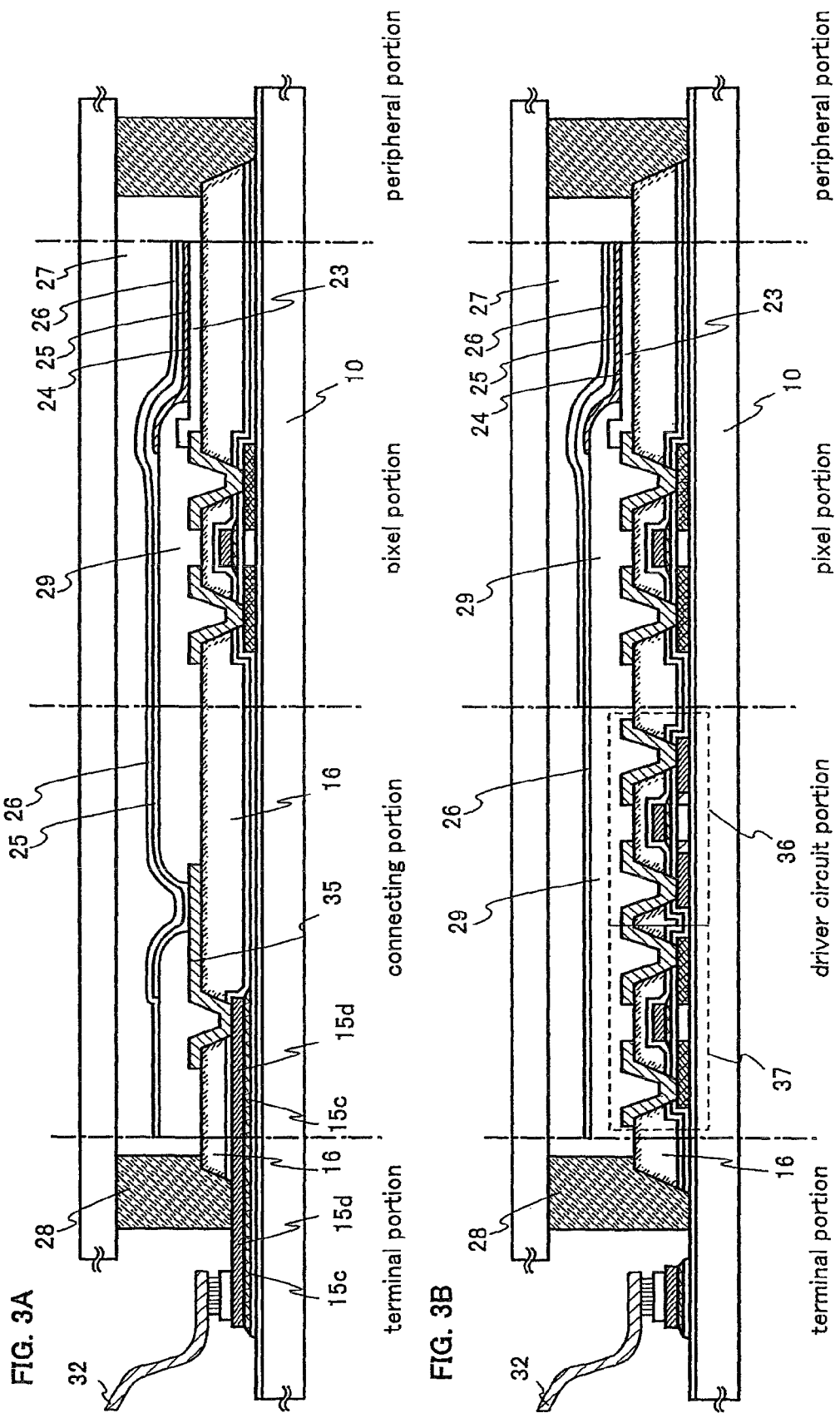

pixel portion pixel portion pixel portion terminal portion | pixel portion | peripheral portion terminal portion | pixel portion | peripheral portion terminal portion | pixel portion | peripheral portion FIG. 12A
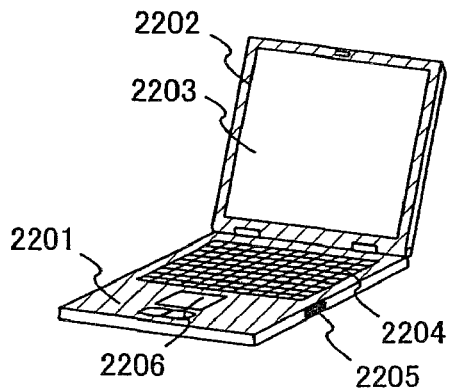
FIG. 12B  folded state
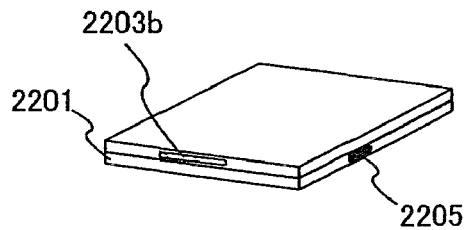
FIG. 12C
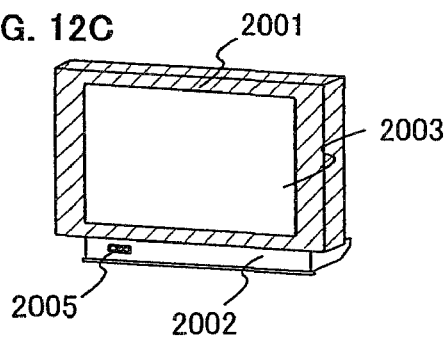
FIG. 12D
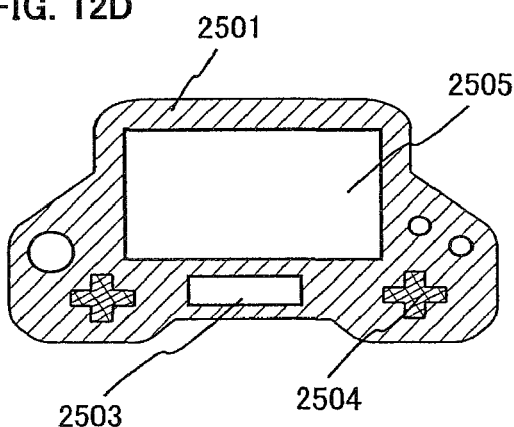
FIG. 12E
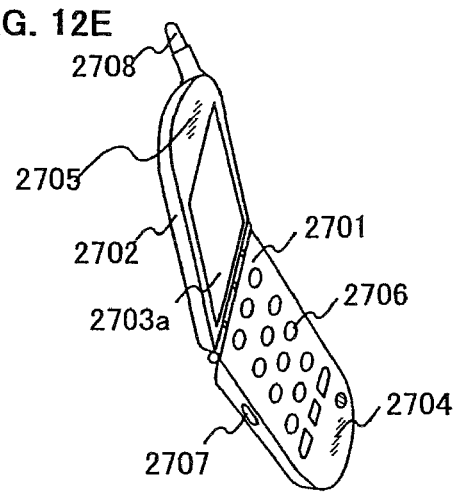
FIG. 12F  folded state
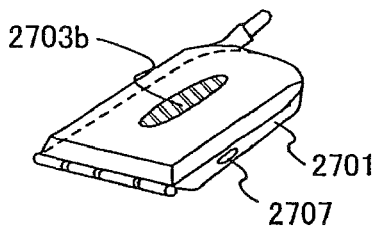
FIG. 12G
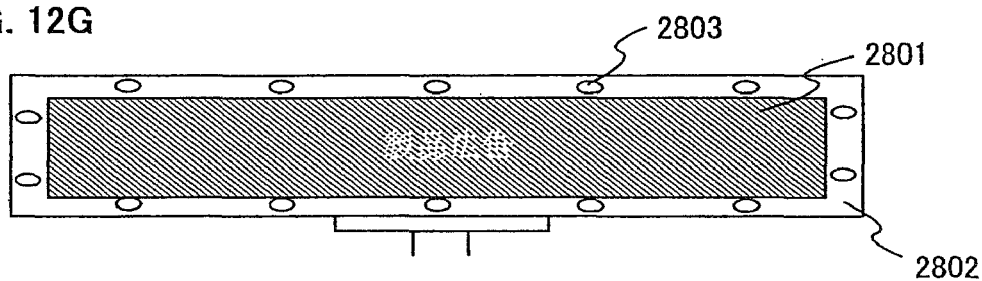

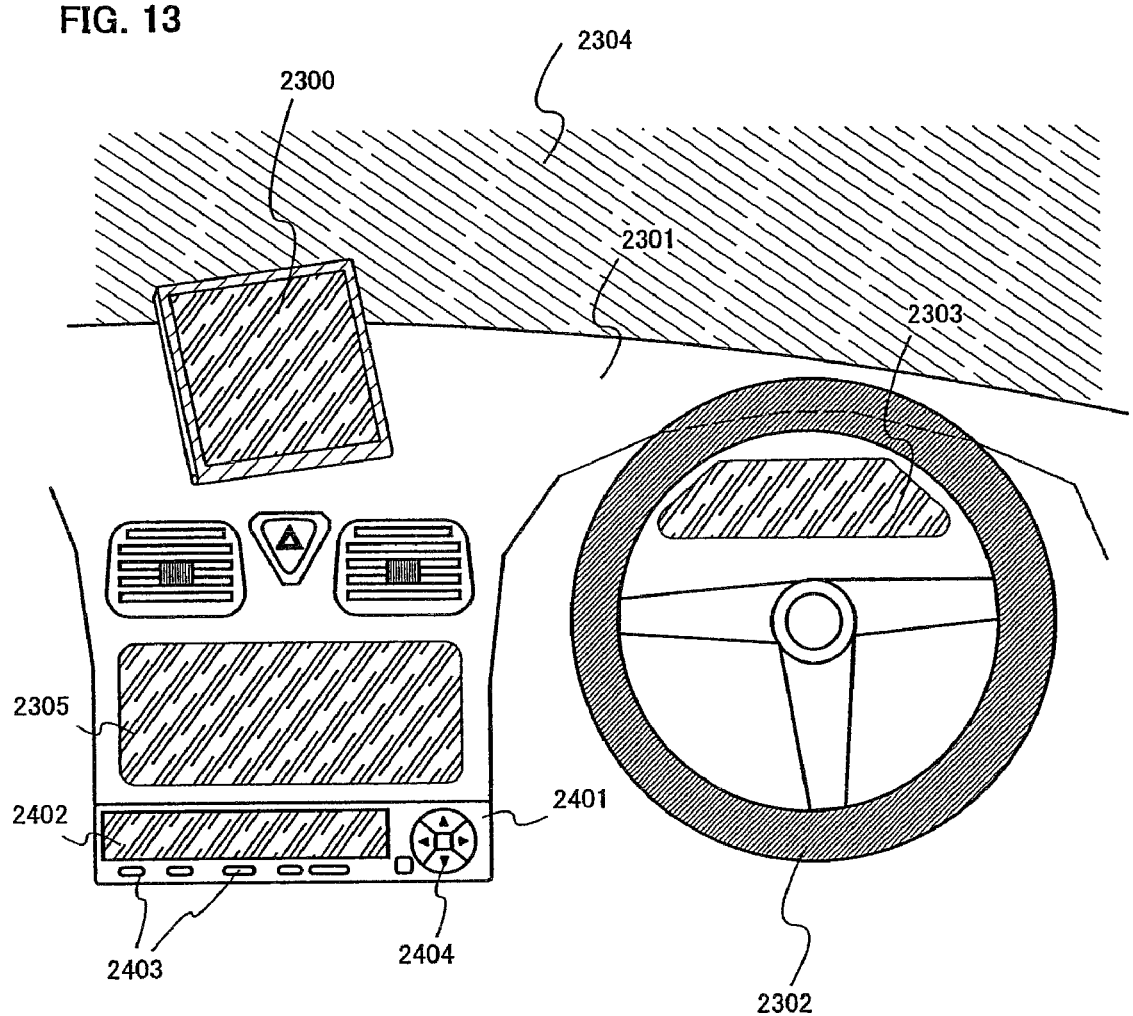

ELECTRONICS DEVICE, SEMICONDUCTOR DEVICE, AND METHOD FOR MANUFACTURING THE SAME

BACKGROUND OF THE INVENTION

1. Field of Invention

The present invention relates to a semiconductor device having a circuit including a thin film transistor (hereinafter referred to as a TFT), and to a method for manufacturing the same. For example, the invention relates to an electronics device on which an electrooptical device typified by a liquid crystal display panel or a light emitting display device having an organic light emitting element is mounted as its component.

In this specification, the term semiconductor device refers to a device in general that utilizes semiconductor characteristics to function, and electro-optical devices, semiconductor circuits and electronics devices are all included in the semiconductor device.

2. Description of the Related Art

In recent years, a technique for forming a thin film transistor (a TFT) by using a semiconductor thin film (thickness is about from several nm to several hundreds nm) formed over a substrate having an insulating surface has drawn attention. The thin film transistor has gained a wide application in electronics devices such as an IC and an electrooptical device, and particularly, development of a TFT as a switching element for an image display device has been hurriedly carried out In order to obtain a high quality image in an image display device, An active matrix liquid crystal display device and an active matrix light emitting device as image display devices in which pixel electrodes are arranged in matrix and TFTs as switching elements connected to the respective pixel electrodes are used have drawn an attention.

Such an active matrix display device has been expanded in application. Therefore, the device is required to have high resolution, high opening ratio, and high reliability with the increase in a screen size.

It is possible to form a pixel portion that performs image display, and a driver circuit for controlling a pixel portion such as a shift register circuit, a level shifter circuit, a buffer circuit, a sampling circuit, or the like based on a CMOS circuit in each functional block, over a single substrate for a liquid crystal module mounted on a liquid crystal display device.

Further, in the pixel portion of the liquid crystal module, a TFT (a pixel TFT) is arranged in each of several tens to several millions of pixels and each pixel TFT is provided with a pixel electrode. A counter electrode is provided on a counter substrate side so that a liquid crystal is interposed between the two electrodes, to thereby form a kind of capacitor with the liquid crystal used as a dielectric. A voltage applied to each pixel is then controlled by a switching function of the TFT to control the application of charge to the capacitor. Thus, the liquid crystal is driven, thereby displaying an image through the control of an amount of transmitted light.

In a liquid crystal display device, when a pixel electrode is formed over an interlayer insulating film having unevenness, unevenness is also formed on the surface of the pixel electrode along the unevenness of the interlayer insulating film. The uneven portion has a possibility to cause an orientation defect of a liquid crystal.

In recent years, research related to a light emitting device having an EL element as a self-luminous light emitting element has been activated. The light emitting device is also referred to as an organic EL display or an organic light emitting diode. Since these light emitting devices have characteristics such as rapid speed of response that is suitable for movie display, low voltage, low power consumption driving, they attracts an attention for a next generation display including a new generation's cellular phone and a personal digital assistance (PDA).

As for the EL element, it is said that by sandwiching an organic compound layer between a pair of electrodes and applying voltage therebetween, an electron injected from a cathode and a hole injected from an anode are recombined at luminescence center in the organic compound layer to form a molecular exciton and when the molecular exciton returns to the ground state, energy is discharged to emit light. There are known singlet excitation and triplet excitation in an excited state, and it seems that light can be emitted by way of either of the excited states.

There are an inorganic light emitting material and an organic light emitting material as a light emitting material used for an EL element, and the organic light emitting material driven with low voltage draws attention.

However, also in a light emitting device using an EL element, when an anode (or a cathode) is formed over an interlayer insulating film having unevenness, there is a possibility that short is generated between the anode and the cathode since a layer containing an organic compound is thin.

Further, an organic EL element using an organic material for an EL element has a problem that luminescence properties such as luminance or evenness of luminescence significantly deteriorate compared to an early period. The low reliability is a factor causing the practical application to be limited.

As one factor of worsening reliability, moisture or oxygen which intrudes into the organic EL element from outside is given.

In an EL display device (panel) using an EL element, moisture intruding inside cause a severe reliability lowering to generate a dark spot, shrink or luminance deterioration from the periphery of a light emitting display device. The dark spot is a phenomenon in which luminance deteriorates partly (including a pixel which does not emit light). The dark spot is generated when a hole emerges on an upper electrode, for example. Shrink is a phenomenon in which luminance deteriorates from an edge of a pixel.

Accordingly, a display device having a structure for preventing the above-mentioned deterioration of the EL element has been developed. In order to prevent the foregoing problems, there is a method in which the EL element is stored in an airtight container to shield from outside air by sealing the EL element in the enclosed space, and a desiccant is further provided separate from the EL element in the enclosed space (for example, Reference 1: Japanese Patent Laid-Open No. Hei 9-148066).

Further, there is another method in which a sealant is formed over an insulator with the EL element formed thereon, and an enclosed space surrounded by a covering member and the sealant is filled with a filler made of a resin or the like; therefore, the EL element is sealed from outside (for example, Reference 2: Japanese Patent Laid-Open No. Hei 13-203076).

In the above-mentioned references, a sealant is formed over an insulator with an EL element formed thereon, and an enclosed space surrounded by a covering member and the sealant is formed.

Briefly, moisture which causes deterioration such as a dark spot intrudes into a display device after sealing in most cases.

In addition, moisture or oxygen intrudes mainly through the sealant since an insulator and a covering material are made of metal or glass in most cases.

When the sealant for sealing is on laminated films, all the laminated films are to directly contact with atmosphere outside of a panel. Therefore, moisture or oxygen outside the panel intrudes inside the display device through the laminated films. Further, when a material high in moisture permeability and water-absorbing property such as acrylic is used as an interlayer film, intruding moisture or oxygen is increased.

In addition, in the case of performing patterning of a partition wall, or an aperture step or a washing step of a contact hole after forming the interlayer film, when the interlayer film has a water absorption property, moisture is included inside the interlayer film during these steps.

Moisture or oxygen intrudes from an exterior surface of the interlayer film, then, intrudes into the interlayer film which is directly contact with the EL element after going through a disconnection part and the like generated by poorness of deposition property of source and drain electrodes in the contact hole. Alternatively, moisture included in the interlayer film intrudes into of the EL element. It is thought that various deterioration such as internal contamination of an EL display device, deterioration of electric property, a dark spot or shrink.

BRIEF SUMMARY OF THE INVENTION

It is an object of the present invention to provide a high reliable EL display device and a manufacturing method thereof without enlarging the EL display device by shielding intruding moisture or oxygen, which is a factor of deteriorating the property of an EL element.

In addition, the invention provides an interlayer insulating film which has sufficient planarity and insulation in an insulating film having planarity used for a semiconductor device and in which moisture content does not change even when a wet step is performed later.

In the invention, an interlayer insulating film which is high in heat resistance, insulation and planarization rate is required as an interlayer insulating film provided for planarization. It is preferable to use application typified by spin coat as a method for forming such an interlayer insulating film rather than CVD or vapor deposition.

In the invention, application is used as a method for forming a high thermostability planarizing film, typically, an interlayer insulating film (a film which serves as a base film of a light emitting element later) over a TFT in which a skeletal structure is configured by the combination of silicon (Si) and oxygen (O). After the formation, an edge portion or an opening portion is formed to have a tapered shape. Afterwards, distortion is given by adding an inert element with a comparatively large atomic radius to modify or densify a surface (including a side surface) for preventing the intrusion of moisture or oxygen.

A solution ingredient is prevented from intruding into the high thermostability planarizing film or reacting when performing a step with the use of liquid (referred to also as a wet step) later by adding an inert element and modifying a surface of the high thermostability planarizing film. In addition, moisture or a gas is prevented from being released from the inside of the high thermostability planarizing film when a heat treatment step is performed later. Further, moisture or a gas is prevented from being released from the inside of the high thermostability planarizing film by a change over time to enhance reliability of a semiconductor device.

In a liquid display device or a light emitting display device, a circumference of a display portion is surrounded by a sealant and sealed with a pair of substrates. However, an interlayer insulating film of a TFT is provided over the entire surface of a substrate. Therefore, when a pattern of the sealant is described within a circumference edge of the interlayer insulating film, there is a possibility that moisture or an impurity might intrude from a part of the interlayer insulating film which is located outside the pattern of the sealant. Hence, the circumference of the high thermostability planarizing film used as the interlayer insulating film of the TFT is made within the pattern of the sealant, preferably, the edge portion of the high thermostability planarizing film is covered with the sealant so as to overlap with the pattern of the sealant. Further, intrusion of moisture or oxygen is prevented by forming the edge portion of the high thermostability planarizing film to have a tapered shape and adding an inert element thereto highly densify. In addition, etching may be performed for selectively forming only the edge portion of the high thermostability planarizing film to have a tapered shape.

The first configuration of the invention disclosed in this specification is a light emitting device including a display portion which is formed by arranging light emitting elements between a pair of substrates, wherein the light emitting elements are formed over a high thermostability planarizing film formed over one substrate, and the pair of substrates are fixed to each other with a sealant surrounding a circumference of the display portion, and an edge portion of the high thermostability planarizing film has a tapered shape, and is added with an inert element.

In addition, in a liquid crystal display device or a light emitting display device, an opening which serves as a contact hole is formed in an interlayer insulating film. Therefore, a solution ingredient intrudes into the interlayer insulating film or reacts when wet etching or purified water washing is performed in patterning of a wiring performed after forming the opening. Therefore, it is preferable to prevent intrusion of moisture or oxygen by highly densifying a side surface of an opening portion by adding an inert element, after forming an opening in the high thermostability planarizing film. Then, patterning of a wiring is performed. In the invention, a step of forming an opening in the high thermostability planarizing film to have a tapered shape is performed simultaneously with a step of forming an edge portion of the high thermostability planarizing film to have a tapered shape, then, modified by entirely adding an inert element thereto.

In the invention, the method for forming an interlayer insulating film by application is shown in the following. Initially, thinner pre-wet treatment is performed to improve wettability after performing washing with purified water. Then, a liquid raw material called varnish in which a low molecular weight ingredient (a precursor) having the combination of silicon (Si) and oxygen (O) is dissolved into a solvent is applied over the substrate by spin coat or the like. Afterwards, an interlayer insulating film can be obtained as a thin film by conducting volatilization (evaporation) of a solvent and crosslinking reaction of the low molecular weight ingredient by heating the varnish along with a substrate. Then, a portion of the interlayer insulating film formed in a circumference of the substrate is removed. In addition, a film thickness is controlled by a spin rotation rate, rotation time, and the density and viscosity of the varnish.

As a material of the interlayer insulating film, a material in which a skeletal structure is configured by the combination of silicon (Si) and oxygen (O), and which has at least one kind of hydrogen, fluorine, an alkyl group or aromatic hydrocarbon as a substituent. The interlayer insulating film after baking can be referred to as an SiOx film containing an alkyl group.

In addition, as the added inert element, one kind or plural kinds of He, Ne, Ar, Kr and Xe can be used. Above all, it is preferable to use argon since it has the comparatively large atomic radius and is inexpensive. It is also preferable that light transmittance of the interlayer insulating film does not decrease even when the inert element is added. The inert element may be appropriately added by using ion doping, ion implantation or plasma treatment.

The second configuration of the invention is a light emitting device having a display portion which is formed by arranging a light emitting elements between a pair of substrates, wherein the light emitting elements are connected to thin film transistors formed over one substrate, a high thermostability planarizing film added with an inert element as an interlayer insulating film is formed over the thin film transistors, and the light emitting elements are formed over the high thermostability planarizing film.

The third configuration of the invention is a light emitting device having a display portion formed by arranging light emitting elements between a pair of substrates, wherein the light emitting elements are connected to thin film transistors formed over one substrate, a high thermostability planarizing film added with an inert element as an interlayer insulating film is formed over the thin film transistors, a source electrode or a drain electrode of the thin film transistor is connected to an active layer through an opening portion provided in the high thermostability planarizing film, the opening portion has a tapered shape and added with the inert element, and the light emitting element is formed over the high thermostability planarizing film.

As for the above-mentioned second or third configuration, the pair of substrates are fixed to each other with a sealant surrounding a circumference of the display portion, and an edge portion of the high thermostability planarizing film has a tapered shape and added with an inert element.

In addition, as for each above-mentioned configuration, the inert element contained in the high thermostability planarizing film is within the concentration range from $1 \times 10^{19}$ atoms/$cm^3$ to $5 \times 10^{21}$ atoms/$cm^3$, typically, from $2 \times 10^{19}$ atoms/$cm^3$ to $2 \times 10^{21}$ atoms/$cm^3$.

In addition, as for each above-mentioned configuration, a taper angle at an edge portion of the high thermostability planarizing film is more than 30° and less than 75°. However, when the inert element is added by using plasma treatment or oblique doping, a side surface of the high thermostability planarizing film can be modified without forming the edge portion to have a tapered shape.

In addition, as for each above-mentioned configuration, the sealant covers the side surface of the edge portion of the high thermostability planarizing film, or surrounds a circumference of the high thermostability planarizing film. When the sealant is arranged so as to cover the side surface of the edge portion of the high thermostability planarizing film, an EL display device with high reliability can be obtained by shielding intruding moisture or oxygen which causes deterioration of properties of an EL element without enlarging an EL display device.

In each above-mentioned configuration, the light emitting device is applicable to both an active matrix type and a passive matrix type.

Further, a light emitting element (an EL element) has a layer containing an organic compound achieving luminescence (Electro Luminescence) generated by applying an electric field, an anode, and a cathode. The luminescence in the organic compound includes luminescence (fluorescence) in returning from a singlet excited state to the ground state and luminescence (phosphorescence) in returning from a triplet excited state to the ground state. A light emitting device fabricated according to the invention is applicable to both cases of using luminescence.

A light emitting element (an EL element) having an EL layer is constituted by a structure in which the EL layer is sandwiched between a pair of electrodes and the EL layer is normally constructed by a laminated structure. Typically, there is pointed out a laminated structure of "hole transporting layer/light emitting layer/electron transporting layer." The structure is provided with very high luminescence efficiency and currently, almost all the light emitting devices on which research and development has been progressed with adopting the structure.

Further, otherwise, it may be a structure of laminating a hole injecting layer, a hole transporting layer, a light emitting layer, and an electron transporting layer, or a hole injecting layer, a hole transporting layer, a light emitting layer, an electron transporting layer, and an electron injecting layer, constructed in this order over an anode. The light emitting layer may be doped with a fluorescent pigment or the like. Further, all of the layers may be formed by using a low molecular weight material or using a high molecular weight material. In addition, a layer containing an inorganic material may be used. Further, in the specification, all the layers provided between a cathode and an anode are generally referred to as EL layers. Therefore, all of the hole injecting layer, the hole transporting layer, the light emitting layer, the electron transporting layer and the electron injecting layer are included in the EL layers.

In the light emitting device according to the invention, the driving method for screen display is not especially limited. For example, a dot-sequential driving method, a line-sequential driving method, or a plane-sequential driving method can be used for the driving. Typically, the line-sequential driving method is used, and a time-division gray scale driving method or an area gray scale driving method may also be used appropriately. In addition, a video signal for inputting into a source line of the light emitting device may be an analog signal or a digital signal. A driving circuit or the like may be appropriately designed in accordance with the video signal.

The fourth configuration regarding a manufacturing method is a method for manufacturing a light emitting device having a thin film transistor and a light emitting element over a substrate having an insulating surface, wherein the method for manufacturing the light emitting device includes the steps of: forming a thin film transistor having a semiconductor layer having a source region, a drain region and a channel forming region therebetween, a gate insulating film and a gate electrode over a first substrate having an insulating surface; forming a high thermostability planarizing film over unevenness shape caused by the thin film transistor; forming an opening portion which has a side with a tapered shape, and is located over the source region or the drain region, and a circumference having a tapered shape by selectively removing the high thermostability planarizing film; adding an inert element to the high thermostability planarizing film; forming a contact hole which reaches the source region or the drain region by selectively removing the gate insulating film; forming an electrode which reaches the source region or the drain region and an anode; forming a layer containing an organic compound over the anode; forming a cathode over the layer containing the organic compound; sealing the light emitting element by attaching a second substrate to the first substrate with a sealant surrounding a circumference of the light emitting element.

The fifth configuration of the invention regarding a manufacturing method is a method for manufacturing a light emitting device having a thin film transistor and a light emitting element over a substrate having an insulating surface, wherein the method for forming the light emitting device includes the steps of: forming a thin film transistor having a semiconductor layer having a source region, a drain region and a channel forming region therebetween, a gate insulating film and a gate electrode over a first substrate having an insulating surface; forming a high thermostability planarizing film over unevenness shape caused by the thin film transistor; forming a contact hole which has a side with a tapered shape and reaches the source region or the drain region, and a circumference having a tapered shape by selectively removing the high thermostability planarizing film; adding an inert element to the high thermostability planarizing film; forming an electrode and an anode which reaches the source region or the drain region; forming a layer containing an organic compound over the anode; forming a cathode over the layer containing the organic compound; and sealing the light emitting element by attaching a second substrate to the first substrate with a sealant surrounding a circumference of the light emitting element.

As for the above-mentioned fourth and fifth configurations, the high thermostability planarizing film is an SiOx film containing an alkyl group formed by application. The step of adding the inert element to the high thermostability planarizing film in the configurations 4 and 5 is performed by ion doping, ion implantation or plasma treatment.

The sixth configuration of the invention is a semiconductor device including a display portion formed by arranging thin film transistors between a pair of substrates, wherein a high thermostability planarizing film to which an inert element is formed over the thin film transistors as an interlayer insulating film, a source electrode or a drain electrode of the thin film transistor is connected to an active layer through an opening portion provided in the high thermostability planarizing film, and the opening portion has a tapered shape and added with an inert element.

According to the sixth configuration, the pair of substrates are fixed to each other with a sealant surrounding a circumference of the display portion, and an edge portion of the high thermostability planarizing film has a tapered shape and added with an inert element.

The seventh configuration of the invention is a semiconductor device including a display portion formed by arranging thin film transistors between a pair of substrates, wherein a high thermostability planarizing film in which a surface is modified by an inert element is formed over the thin film transistors as an interlayer insulating film, and a source electrode or a drain electrode of the thin film transistor is connected to an active layer through an opening portion provided in the high thermostability planarizing film.

The present invention is applicable to any TFT structure. For instance, the invention can be applied to a top gate TFT, a bottom gate (inversely staggered) TFT or a staggered TFT.

As an active layer of the TFT, an amorphous semiconductor film, a semiconductor film containing a crystal structure, a semiconductor compound film containing an amorphous structure can be appropriately used. Further, a semi-amorphous semiconductor film which is semiconductor having an intermediate structure of an amorphous structure and a crystal structure (including single crystal and polycrystal), and a tertiary state which is stable energetically, and including a crystalline region having a short distance order and lattice distortion (also referred to as a microcrystal semiconductor film) can be used as the active layer of the TFT. In the semi-amorphous semiconductor film, a crystal grain having a grain diameter from 0.5 nm to 20 nm is included in at least one region of the film, and in the Raman spectrum, the peak specific to silicon shifts to the lower side of wave number of 520 cm$^{-1}$. In addition, in the semi-amorphous semiconductor film, a diffraction peak of (111) and (220) derived from a Si crystal lattice is observed in x-ray diffraction. The semi-amorphous semiconductor film includes hydrogen or halogen at least 1 atom % as a neutralizer of an uncombined hand (a dangling bond). The semi-amorphous semiconductor film is manufactured by performing glow discharging decomposition (plasma CVD) of a silicide gas. As the silicide gas, $SiH_4$, additionally, $Si_2H_6$, $SiH_2Cl_2$, $SiHCl_3$, $SiCl_4$, $SiF_4$ or the like can be used. The silicide gas may be diluted with $H_2$, or $H_2$ and one or more of rare gas elements: He, Ar, Kr, and Ne. Dilution ratio is within the range from 2 times to 1000 times. Pressure is roughly within the range from 0.1 Pa to 133 Pa; power frequency, from 1 MHz to 120 MHz, preferably from 13 MHz to 60 MH; and substrate heating temperature, at most 300° C., preferably from 100° C. to 250° C. An atmospheric constitution impurity such as oxygen, nitrogen or carbon as an impurity element within a film is preferably at most $1 \times 10^{20}$ atoms/cm$^3$, in particular, oxygen concentration is at most $5 \times 10^{19}$ atoms/cm$^3$, preferably, at most $1 \times 10^{19}$ atoms/cm$^3$. Note that electric field-effect mobility μ of a TFT in using a semi-amorphous film as an active layer is from 1 cm$^2$/Vsec to 10 cm$^2$/Vsec.

According to a high thermostability planarizing film of the invention, an orientation defect of a liquid crystal can be prevented by eliminating unevenness due to a gate electrode or a semiconductor layer in a liquid crystal display device. The high thermostability planarizing film can have high light transmittance and preferable display properties.

In addition, in a light emitting device using a layer containing an organic compound as a light emitting layer, reliability is improved by providing an interlayer insulating film which has the small amount of dehydration and degasification, and a structure in which moisture, oxygen, or the like is prevented from passing through the interlayer insulating film from outside and intruding into an organic EL element without enlarging the light emitting device.

BRIEF DESCRIPTION OF DRAWINGS

FIGS. 3A and 3B are sectional views of a light emitting device.

FIGS. 12A to 12G are views showing examples of an electronics device.

FIG. 13 is a view showing an example of an electronics device.

DETAILED DESCRIPTION OF THE INVENTION

Embodiment Mode

Figure 1A:
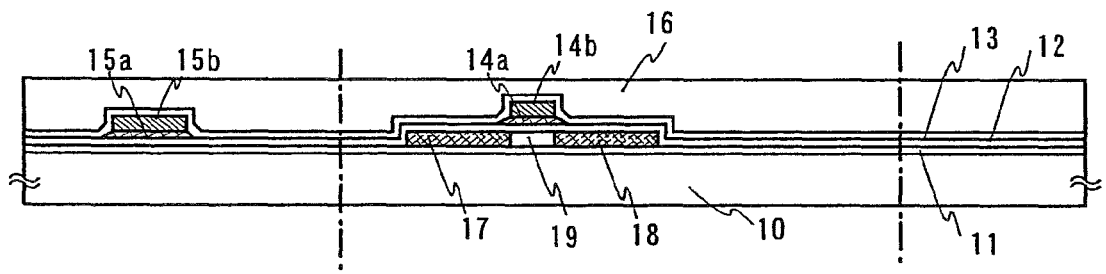
FIGS. 1A to 1D show manufacturing steps of a light emitting device.

An embodiment mode of the present invention is described hereinafter.

A base insulating film 11 is formed over a substrate 10. As the substrate 10, a glass substrate, a quartz substrate, a silicon substrate, a metal substrate or a stainless steel substrate with an insulating film formed on its surface may be used. A plastic substrate durable to the processing temperature may also be used.

As the base insulating film 11, an insulating film such as a silicon oxide film, a silicon nitride film or a silicon oxynitride film may be used. Although a two-layer structure is used for the base insulating film 11 in this embodiment mode, a structure having a single layer film, or two or more laminated layers of the insulating films may be used. Note that the base insulating film need not be formed particularly.

Then, a semiconductor layer is formed over the base insulating film. The semiconductor layer is obtained by forming a semiconductor film having an amorphous structure by a known method (sputtering, LPCVD, plasma CVD, or the like), crystallizing the semiconductor film by known crystallization treatment (laser crystallization, thermal crystallization, thermal crystallization using a catalyst such as nickel, or the like), and patterning the crystalline semiconductor film to have a desired shape using a first photomask. The semiconductor layer is formed to have a thickness from 25 nm to 80 nm (preferably, from 30 nm to 70 nm). There is no particular limit to a material for the crystalline semiconductor film; however, the crystalline semiconductor film may be preferably made of silicon, a silicon-germanium (SiGe) or the like.

In addition, a continuous oscillation laser may be used for crystallization treatment of the semiconductor film having the amorphous structure. When crystallizing the amorphous semiconductor film, it is preferable that second to fourth harmonics of a fundamental wave may be applied by using a solid laser in which continuous oscillation is possible to obtain a crystal with a large grain diameter. Typically, the second harmonic (532 nm) or the third harmonic (355 nm) of an Nd: YvO$_4$ laser (a fundamental wave, 1064 nm) may be applied. When the continuous oscillation laser is used, laser light radiated from a continuous oscillation YvO$_4$ laser of output of 10 W is converted to harmonic by a nonlinear optical element. There is also a method for radiating harmonic by putting a YvO$_4$ crystal and the nonlinear optical element in a resonator. Then, the harmonic is preferably formed so as to have a rectangular or elliptical shape on an irradiated surface by an optical system and an object to be processed is irradiated therewith. At this time, the energy density of about from 0.01 MW/cm$^2$ to 100 MW/cm$^2$ (preferably from 0.1 MW/cm$^2$ to 10 MW/cm$^2$) is required. The semiconductor film may be irradiated by being moved relatively to the laser light at the speed of about from 10 cm/s to 2000 cm/s.

Subsequently, an insulating film 12 covering the semiconductor layer is formed after removing the resist mask. The insulating film 12 is formed to have a thickness of from 1 nm to 200 nm by using plasma CVD or sputtering. Preferably, the insulating film 12 is formed by performing surface nitriding treatment with the use of plasma by an microwave after forming a monolayer or a laminated structure of the insulating film including silicon to have a thin thickness of 10 nm to 50 nm.

In this way, when the plasma CVD is used for forming the insulating film thin in thickness, it is necessary to obtain the thin thickness with good controllability by latening a formation rate. For example, the deposition speed of the silicon oxide film can be set at 6 nm/min when RF power is set at 100 W, 10 kHz; pressure, 0.3 Torr; an N$_2$O gas flow, 400 sccm; and an SiH$_4$ gas flow, 1 sccm. The nitriding treatment with the use of the plasma by the microwave is performed with the use of a microwave source (2.45 GHz) and a nitrogen gas which is a reactive gas.

Note that the nitrogen concentration decreases as departing from the surface of the insulating film 12. Because of this, the surface of the silicon oxide film can be nitrided at high concentrations. In addition, deterioration of device properties can be prevented by reducing nitrogen of the interface between the silicon oxide film and an active layer. In addition, the insulating film 12 having the surface treated with nitriding functions as a gate insulating film of a TFT.

Next, a conductive film is formed over the insulating film 12 to have a thickness of 1 from 100 nm to 600 nm. Here, a conductive film including a laminate of a TaN film and a W film is formed by using sputtering. The laminate of the TaN film and the W film is cited here as the conductive film, but it is not limited hereto. As for the conductive film, a monolayer containing an element of Ta, W, Ti, Mo, Al or Cu, an alloy material or a compound material containing the above element as its main component, or a laminate of the monolayers can be used. A semiconductor film typified by a polycrystalline silicon film in which an impurity element such as phosphorous is doped may be also used.

Subsequently, a resist mask is formed by using a second photomask, and etching is performed by wet etching or dry etching. In the etching step, the conductive film is etched to obtain conductive layers 14a, 14b, 15a, and 15b. In addition, the conductive layers 14a and 14b function as a gate electrode of the TFT, and the conductive films 15a and 15b function as a terminal electrode.

Next, a resist mask is newly formed by using a third photomask after removing the resist mask. A first doping step is performed to dope an impurity element which imparts n-type conductivity (typically, phosphorus or As) to a semiconductor at low concentrations to form an n-channel TFT not shown herein. The resist mask covers a region which is to serve as a p-channel TFT and a region adjacent to the conductive layer. A low concentration impurity region is formed by this first doping step through the insulating film. Although a plurality of TFTs are used to drive one light emitting element, the above-mentioned doping step is not necessary when the light emitting element is driven by only p-channel TFTs.

Then, a resist mask is newly formed by using a fourth photomask after removing the resist mask. A second doping step is performed to dope an impurity element which imparts p-type conductivity (typically, boron) to a semiconductor at high concentrations. P-type high concentration impurity regions 17 and 18 are formed by performing doping through the insulating film 12 by the second doping step.

Then, a resist mask is newly formed by using a fifth photomask. A third doping step is performed to dope an impurity element which imparts n-type conductivity (typically, phosphorus or As) to a semiconductor at high concentrations to form an n-channel TFT not shown herein. The third doping step is performed under the condition that the amount of doze is set at from $1\times10^{13}$ atoms/cm$^2$ to $5\times10^{15}$ atoms/cm$^2$; and the acceleration voltage, from 60 kV to 100 kV. The resist mask covers a region which serves as a p-channel TFT and a region adjacent to the conductive layer. An n-type high concentration impurity region is formed by performing doping through the insulating film 12 by the third doping step.

Afterwards, activation and hydrogenation of the impurity element added to the semiconductor layer are performed after removing the resist mask and forming an insulating film containing hydrogen 13. The insulating film containing hydrogen 13 is formed with the use of a silicon nitride oxide film (an SiNO film) obtained by PCVD. In addition, gettering which reduces nickel concentration in a channel formation region can be also performed at the same time as activation, when the semiconductor film is crystallized by using a metal element which promotes crystallization, which is typically nickel.

Then, a high thermostability planarizing film 16 which serves as an interlayer insulating film is formed. As the high thermostability planarizing film 16, an insulating film in which a skeletal structure is formed by the combination of silicon (Si) and oxygen (O) obtained by application is used.

Here, a formation procedure of the high thermostability planarizing film 16 is described in detail with reference to FIGS. 5A to 5C and FIG. 6.

First, pure water washing of a substrate to be processed is performed. Megasonic washing may be performed. Next, after performing dehydrobaking for 110 seconds at 140° C., a temperature of the substrate is regulated by cooling for 120 seconds with a water-cooled plate. Next, the substrate is transferred to and placed in a spinning applying apparatus shown in FIG. 5A.

Figure 5A:
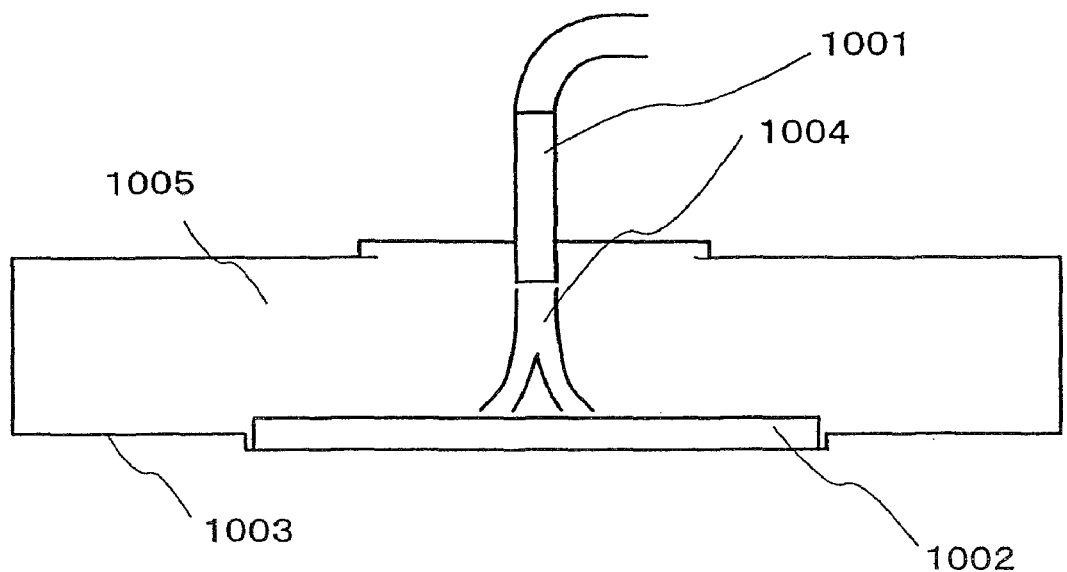
FIGS. 5A to 5C are views showing an application apparatus and an edge remover.

FIG. 5A shows a section schematic diagram of the spinning applying apparatus. In FIG. 5A, reference numeral 1001 denotes a nozzle; 1002, a substrate; 1003, an application cup; and 1004, an application material solution. The spinning applying apparatus has a mechanism in which the solution of a material to be applied is dropped from the nozzle 1001, and the substrate 1002 is placed horizontally in the application cup 1003 and the entire application cup rotates. The spinning applying apparatus also has a mechanism in which the pressure of atmosphere in the application cup 1003 can be controlled.

Next, pre-wet application is performed to improve wettability with the use of an organic solvent such as thinner (a volatile mixture solvent formed by mixing aromatic hydrocarbon (toluene or the like), alcohols, ester acetate or the like). Thinner is thrown off by spinning the substrate with high speed (rotation rate, 450 rpm), after spreading the thinner thoroughly with centrifugal force by spinning the substrate (rotation rate 100 rpm) as dropping 70 ml of the thinner.

Subsequently, the solution of the material to be applied prepared by dissolving siloxane system polymer in a solvent (propylene glycolmonomethyl ether) is thoroughly spread by centrifugal force with gradually spinning (rotation rate from 0 rpm to 1000 rpm) the substrate and dropping the solution of the material to be applied from the nozzle 1001. Then, the substrate is gradually spun (rotation rate from 0 rpm to 1400 rpm) after holding the substrate for 30 seconds for leveling a film formed by the application step.

Inside of the application cup 1003 is exhausted to decompress, then reduced-pressure drying is performed for within 1 minute.

Figure 5B:
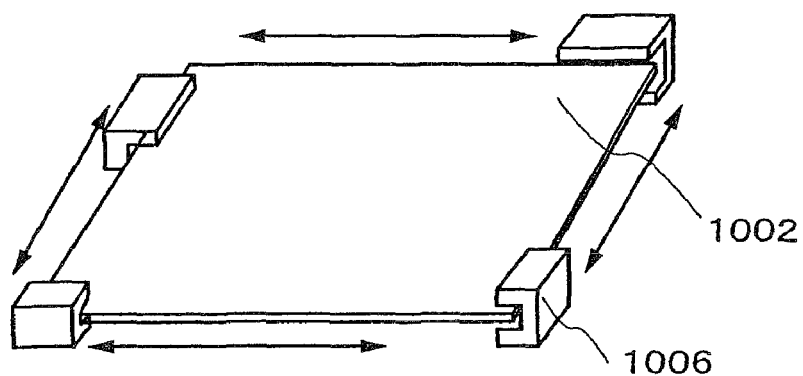
Figure 5C:
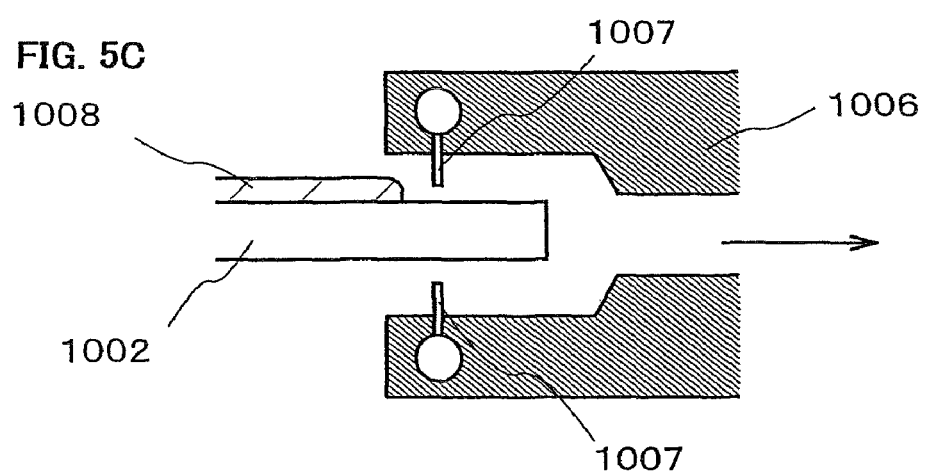

Edge removing treatment is performed by an edge remover equipped in the spinning applying apparatus shown in FIG. 5A. An edge remover 1006 equipped with a means for moving which moves in parallel along the periphery of the substrate 1002 is shown in FIG. 5B. In the edge remover 1006, a thinner spraying nozzle 1007 as in FIG. 5C is provided to sandwich one side of the substrate, and a circumference of the application film 1008 is dissolved by the thinner. Thereby removing the film formed by the application step in the circumference of the substrate edge face by exhausting liquid and gas in the arrow direction shown in the figure.

Then, prebaking is performed by performing baking for 170 seconds at 110° C.

Figure 6:
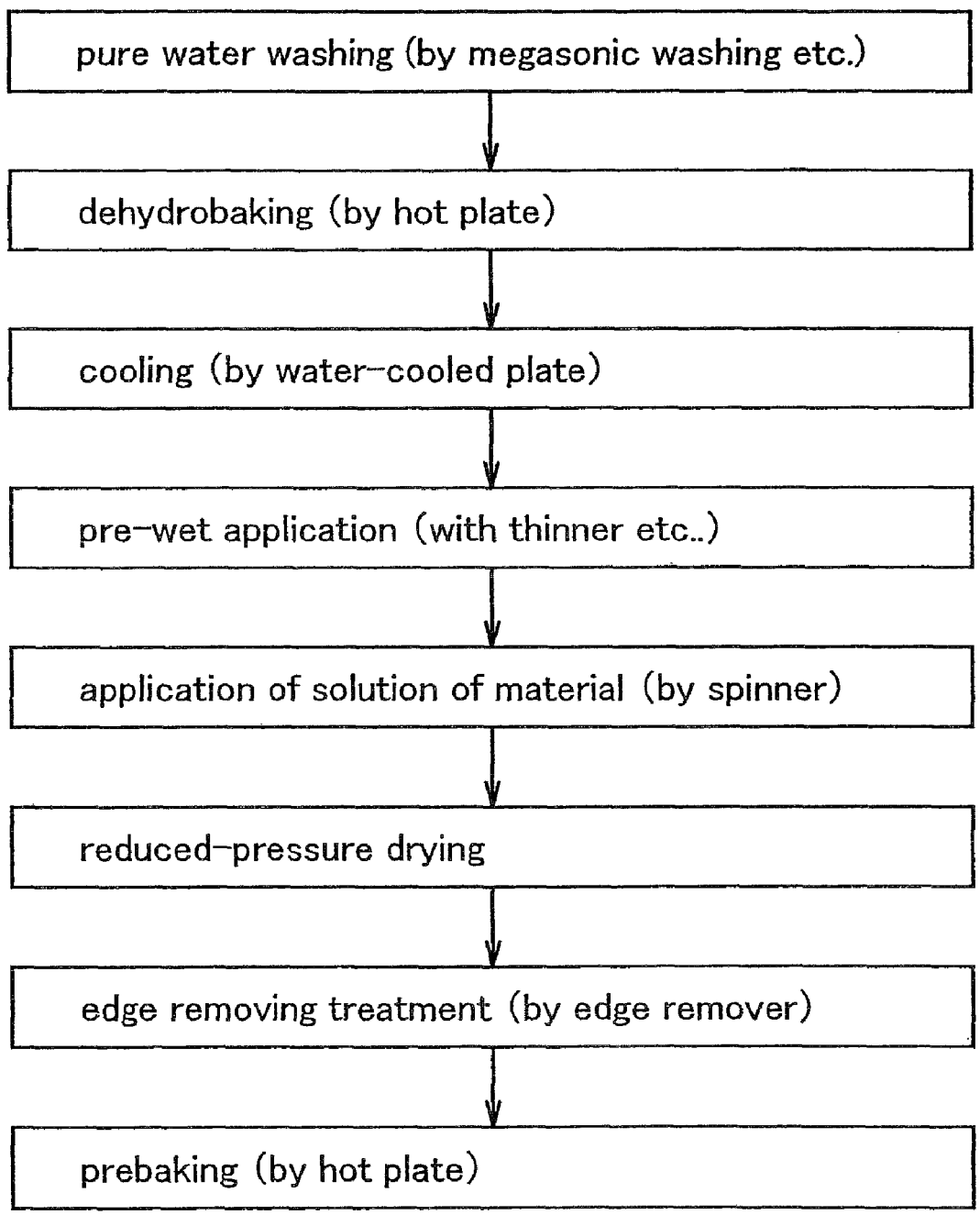
FIG. 6 is a view showing a formation flow of a high thermostability planarizing film.

A flow diagram showing the above-mentioned procedure is shown in FIG. 6.

The substrate is transferred from the spinning applying apparatus and cooled. Then, baking is further performed for 1 hour at 270° C. Thus, the high thermostability planarizing film 16 is formed (FIG. 1A).

In addition, the high thermostability planarizing film 16 may be formed by ink-jet A material solution can be saved with the use of ink-jet.

Figure 1B:
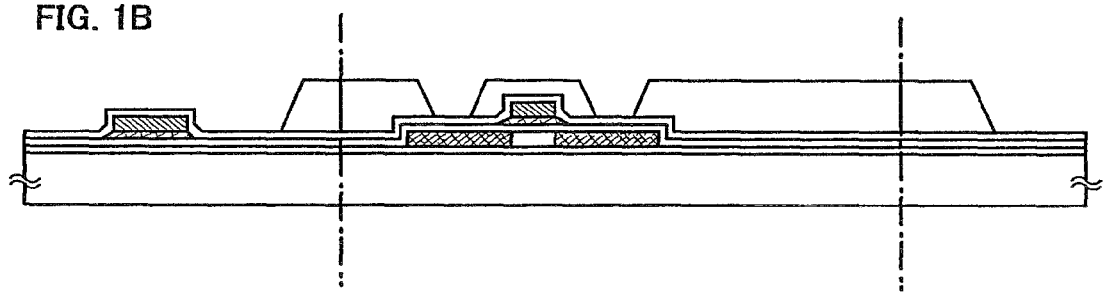

The high thermostability planarizing film 16 in a circumference is removed at the same time as forming a contact hole in the high thermostability planarizing film 16 with the use of a sixth mask. Here, etching (wet etching or dry etching) is performed under the condition in which a desirable selective ratio can be obtained with respect to the insulating film 13. Although there is no limit to an etching gas to be used, $CF_4$, $O_2$, He and Ar is suitable to use. Dry etching is performed by setting the flow of $CF_4$ at 380 sccm; $O_2$, 290 sccm; He, 500 sccm; Ar, 500 sccm; RF power, 3000 W; and pressure, 25 Pa. In addition, the etching time may be increased at the rate of about from 10% to 20% for etching the insulating film 13 without leaving a residue on its surface. One time etching or plural times of etching may be conducted to obtain a tapered shape. Here, the tapered shape is obtained by performing the second time etching with the use of $CF_4$, $O_2$, and He by setting the flow of $CF_4$ at 550 sccm; $O_2$, 450 sccm; He, 350 sccm; RF power, 3000 W; and pressure, 25 Pa (FIG. 1B).

Figure 1C:
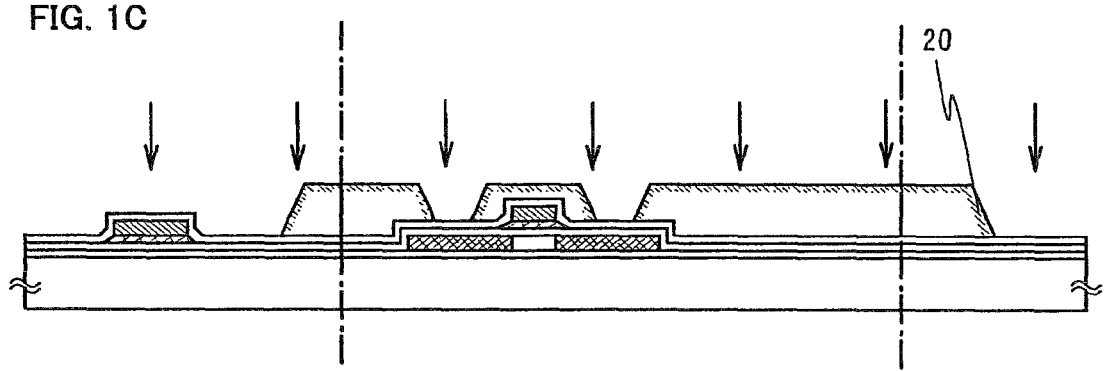

Next, doping treatment with an inert element is performed to form a highly densified part 20 on the surface of the high thermostability planarizing film 16 (FIG. 1C). The doping treatment may be performed by ion doping or ion implantation. Typically, argon (Ar) is used as the inert element. Distortion is given by adding the inert element with a comparatively large atomic radius to modify a surface (including a side surface) or to highly densify for preventing the intrusion of moisture or oxygen. The inert element contained in the highly densified part 20 is set within the concentration range from $1 \times 10^{19}$ atoms/cm$^3$ to $5 \times 10^{21}$ atoms/cm$^3$, typically, from $2 \times 10^{19}$ atoms/cm$^3$ to $2 \times 10^{21}$ atoms/cm$^3$. In addition, the side surface of the high thermostability planarizing film 16 is formed to have a tapered shape so as to be doped. It is desirable to set the taper angle θ more than 30° and less than 75°.

Figure 7A:
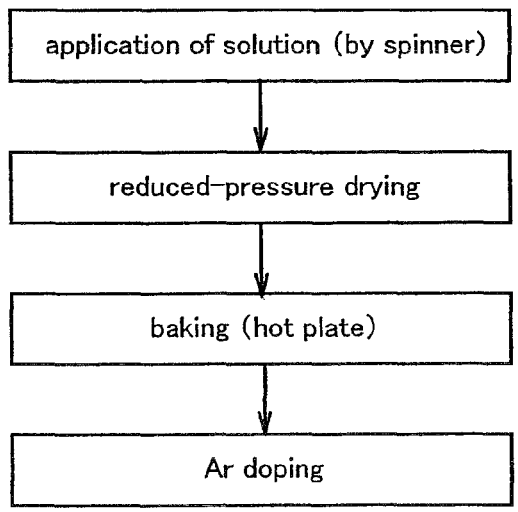
FIGS. 7A to 7C are views showing flows of addition steps of an inert element.
Figure 7B:
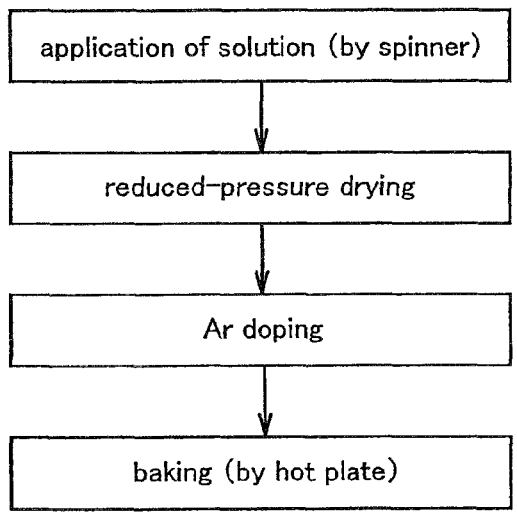
Figure 7C:
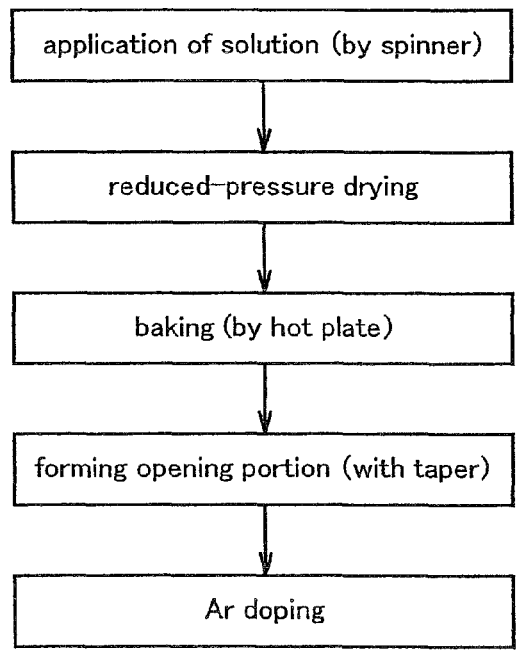

Here, although an application step or a doping step is performed according to the flow shown in FIG. 7C, the flow is not particularly limited to this order. For example, as shown in FIG. 7A, doping of an inert element may be performed after sequentially performing a material solution application, reduced-pressure drying and baking. In addition, as shown in FIG. 7B, baking may be performed after performing a material solution application, reduced-pressure drying and doping of an inert element. However, the inert element is not doped enough into the side surface of an opening portion or the side surface of an edge portion in steps shown in FIGS. 7A and 7B. Therefore, it is preferable to add a process in which doping is further performed from an oblique direction or an inert element is added to the side surface of an opening portion or the side surface of the edge portion.

Corona treatment plasma treatment or coupling agent treatment may be performed before or after formation of the high thermostability planarizing element 16 to improve adhesiveness. In addition, two or more kinds of treatment of the corona treatment, the plasma treatment or the coupling agent treatment can be combined, and in this case, the treatment sequence is not particularly limited.

Then, etching is performed using the high thermostability planarizing film 16 as a mask, and the exposed insulating films 12 and 13 are selectively removed. The etching treatment of the insulating films 12 and 13 is performed by using $CHF_3$ and Ar for etching gases. Note that the etching time may be increased at the rate about from 10% to 20% in order to perform etching without leaving a residue over the semiconductor layer.

Figure 1D:
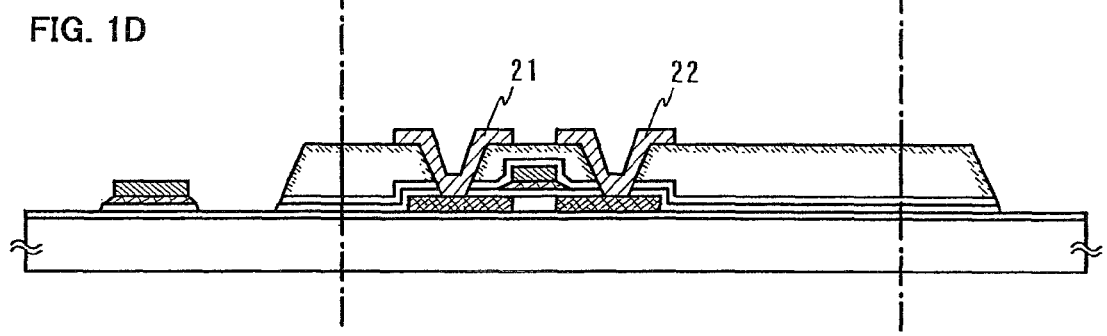

Next, wirings 21 and 22 are formed by performing etching with the use of an eighth mask after forming a conductive film (FIG. 1D).

Subsequently, a first electrode 23, in other words, an anode (or a cathode) of an organic light emitting element is formed with the use of a ninth mask. A film containing a substance of Ti, TN, $TiSi_xN_y$, Ni, W, $WSi_x$, $WN_x$, $WSi_xN_y$, NbN, Mo, Cr, Pt, Zn, Sn, In or Mo, an alloy material or a compound material containing the substance as its main component, or a laminate of the films may be used as the first electrode 23 within the range from 100 nm to 800 nm thick in total.

Figure 4A:
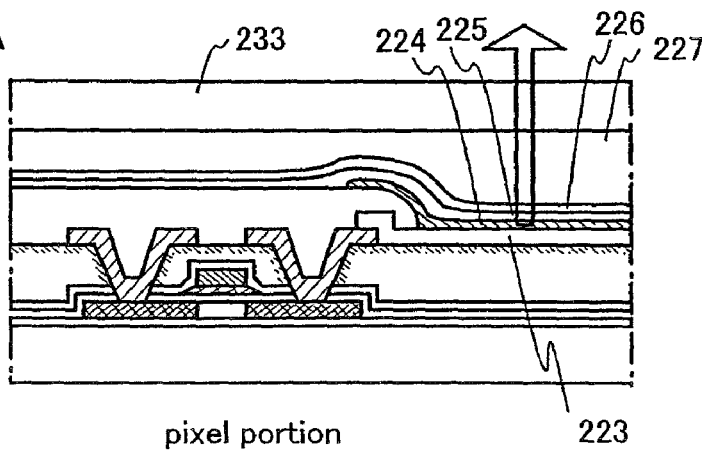
FIGS. 4A to 4C are sectional views of a light emitting element.
Figure 4B:
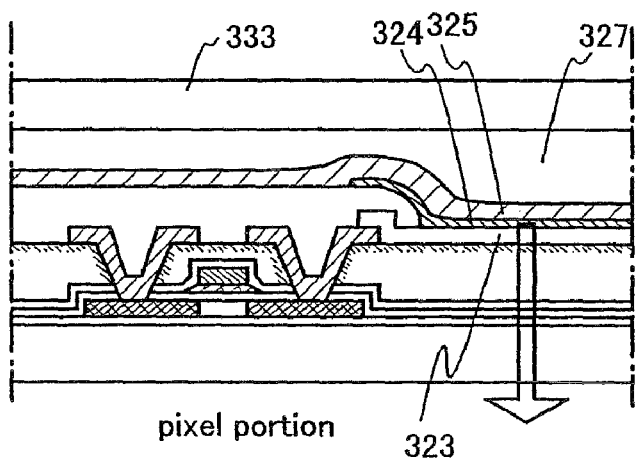
Figure 4C:
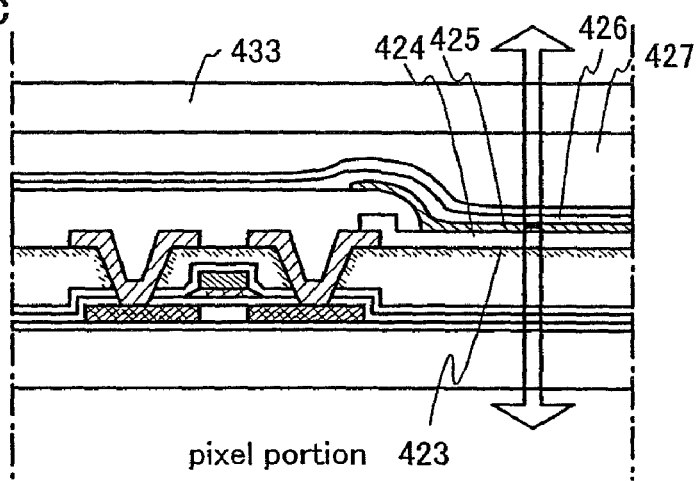

In addition, in the case of a bottom emission light emitting device shown in FIG. 4B, or a light emitting device shown in FIG. 4C, as the material of the first electrode, a transparent conductive film (ITO (indium tin oxide), ITSO, zinc oxide (ZnO), IZO (indium zinc oxide), in which zinc oxide from 2 [%] to 20 [%] is mixed into indium oxide.

Subsequently, an insulator 29 (referred to as a bank, a partition wall, a barrier, or the like) is formed using a tenth mask to cover an edge portion of the first electrode 23. An insulator 29 can include an inorganic material (silicon oxide, silicon nitride, silicon oxynitride, or the like), a photosensitive or non-photosensitive organic material (polyimide, acryl, polyamide, polyimideamide, a resist, or benzocyclobutene), an SOG film (for example, an SiOx film including an alkyl group) obtained by application, or a laminate of these films. For instance, in the case that positive photosensitive acrylic is used as a material for an organic resin, it is preferable to give a curved surface with a radius of curvature only to a top edge portion of the insulator. Both a negative photosensitive material that is insoluble in an etchant under light and a positive photosensitive material that is soluble in an etchant under light can be used for the insulator.

Next, a layer containing an organic compound 24 is formed by evaporation or application. It is preferable to perform vacuum heating before forming the layer containing an organic compound 24, thereby performing deaeration, in order to improve reliability. For example, it is preferable to perform heat treatment at a temperature from 200° C. to 300° C. under a reduced pressure atmosphere or an inert atmosphere in order to remove gas contained in the substrate, before evaporating an organic compound material. In the case of employing evaporation to form the layer containing an organic compound 24, a film formation chamber is evacuated to have a vacuum of at most $5 \times 10^{-3}$ Torr (0.665 Pa), preferably from $10^{-4}$ Torr to $10^{-6}$ Torr. The organic compound is preliminarily vaporized by resistance heating in evaporating. The vaporized organic compound is scattered in the direction of the substrate by opening a shutter at the time of evaporation. The vaporized organic compound is scattered upwardly and is evaporated on the substrate through an opening portion provided for a metal mask.

For example, white light emission can be achieved by sequentially laminating $Alq_3$, $Alq_3$ partially doped with Nile red, which is a red light emitting pigment, p-EtTAZ, and TPD (aromatic diamine) with evaporation.

In the case of forming the layer containing an organic compound by application using spin coating, an applied layer is preferably baked by vacuum heating after application. For example, an aqueous solution of poly (ethylene dioxythiophene)/poly (styrene sulfonic acid), namely, (PEDOT/PSS), may be applied to an entire surface and baked to form a film that serves as a hole injection layer. Then, a polyvinyl carbazole (PVK) solution doped with a luminescent center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) may be applied to the entire surface and baked to form a film that serves as a light emitting layer. The solvent of PEDOT/PSS is water and PEDOT/PSS is not soluble in an organic solvent. Accordingly, the hole injection layer is in no danger of dissolving again even in the case of applying PVK over the PEDOT/PSS. Since the solvents used for PEDOT/PSS and PVK are different from each other, it is preferable not to use the same film formation chambers. The layer containing an organic compound 24 can be formed to have a single layer. In this case, a 1,3,4-oxadiazole derivative (PBD) capable of transporting electrons may be dispersed in polyvinyl carbazole (PVK) capable of transporting holes. In addition, white light emission can also be obtained by dispersing 30 wt % of PBD as an electron transporting agent and dispersing four kinds of pigments (TPB, coumarin 6, DCM1, and Nile red) in appropriate amounts.

The layer containing an organic compound may include layers separately formed with colors of R, G, and B, respectively, to perform full color display in one panel.

Thereafter, a second electrode 25 made of a conductive film, that is, a cathode (or an anode) of an organic light emitting element is formed. A film formed of an alloy such as MgAg, MgIn, AlLi, a compound such as $CaF_2$, or CaN, or a film formed of an element belonging to Group 1 or 2 in the periodic table, and aluminum by co-evaporating may be used as the second electrode 25.

In the case of a top emission light emitting device which emits light through the second electrode as shown in FIG. 4A, or in the case of a light emitting device shown in FIG. 4C, an aluminum film or an aluminum film that contains a minute amount of Li, having a thickness from 1 nm to 10 nm is used. When employing an Al film for the second electrode 25, it becomes possible to form a material in contact with the layer containing an organic compound 24 with a material other than oxide, thereby reliability of the light emitting device can be improved. Further, a light transmitting layer (film thickness from 1 nm to 5 nm) containing $CaF_2$, $MgF_2$, or $BaF_2$ may also be formed as a cathode buffer layer before forming the aluminum film having a thickness from 1 nm to 10 nm.

Subsequently, a transparent protective layer 26 is formed by evaporation or sputtering. The transparent protective layer 26 protects the second electrode 25.

Next, the light emitting element is sealed by attaching a sealing substrate 33 with a sealant 28. The sealing substrate is attached so that the sealant 28 covers an edge portion (tapered portion) of the high thermostability planarizing film 16. Note that a region surrounded by the sealant 28 is filled with a transparent filler 27. There is no particular limitation on the filler 27 as long as the filler is a light transmitting material. Typically, an ultraviolet curable epoxy resin or a heat curable epoxy resin may be used. Here, a highly thermostable UV epoxy resin (product name: 2500 Clear, manufactured by Electrolite Cooperation) may be used, which has an index of refraction of 1.50, viscosity of 500 cps, Shore D hardness of 90, tensile strength of 3000 psi, a Tg point of 150° C., volume resistivity of $1 \times 10^{15}$ Ω·cm, and withstand voltage of 450

V/mil. In addition, total transmittance can be improved by filling interspace between a pair of substrates with the filler 27.

Figure 2A:
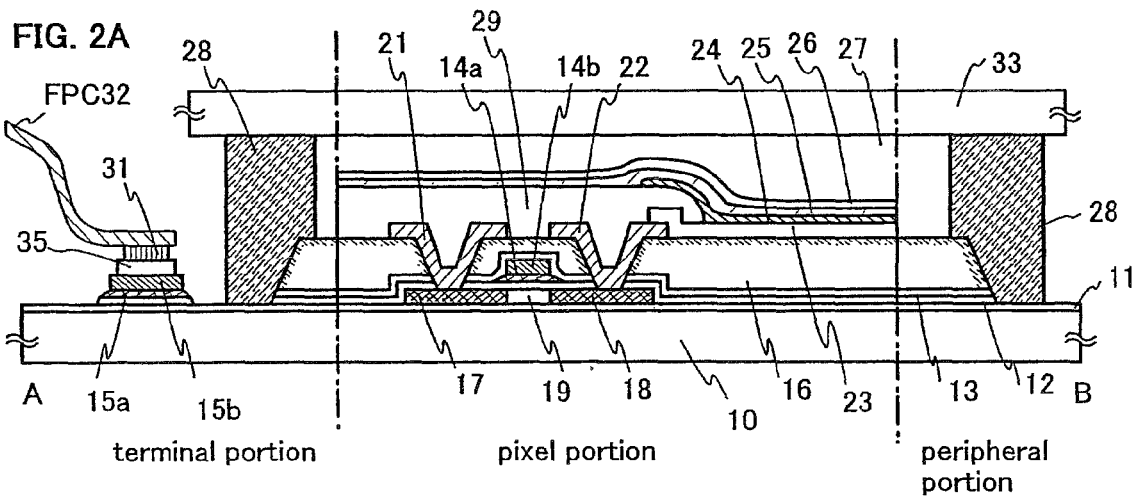
FIGS. 2A to 2C show sectional views and a top view of a light emitting device.

Lastly, an FPC 32 is attached to an terminal electrode 35 with an anisotropic conductive film 31 by a known method. A transparent conductive film is preferably used as the terminal electrode 35 and is formed over terminal electrodes 15a and 15b formed simultaneously with a gate wiring (FIG. 2A).

Figure 2B:
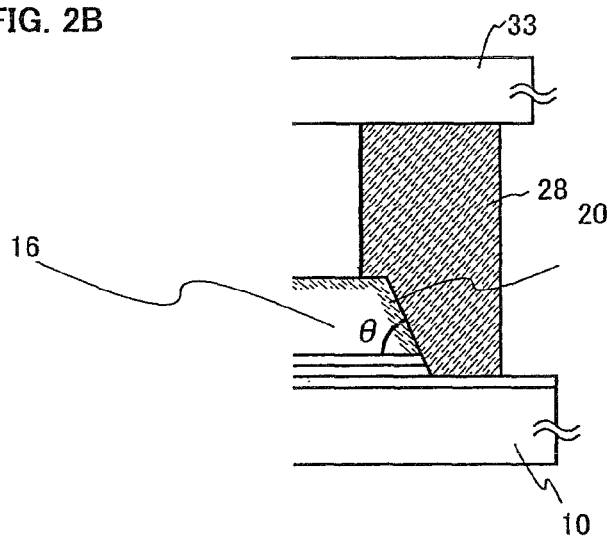

FIG. 2B is an enlarged view of a peripheral portion. A taper angle θ is set at more than 30° and less than 75°.

Figure 2C:
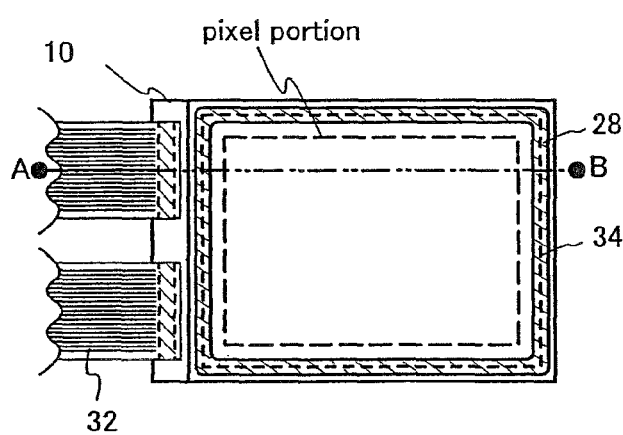

FIG. 2C is a top view. An edge portion 34 of the high thermostability planarizing film is covered with the sealant 28 as shown in FIG. 2C. A cross-sectional view taken along a chained line A-B in FIG. 2C corresponds to FIG. 2A.

FIG. 3A shows a state of connection between the second electrode 26 and a wiring 35 in a lower layer. The wiring 35 is connected to terminal electrodes 15c and 15d. FIG. 3B shows a part of a driver circuit portion composed of an n-channel TFT 36 and a p-channel TFT 37.

An active matrix light emitting device manufactured in this way, has a tapered shape in an edge portion or an opening portion, in the high thermostability planarizing film 16, typically, an interlayer insulating film (a film which serves as a base film of a light emitting element later) in which a skeletal structure is configured by the combination of silicon (Si) and oxygen (O). Further, distortion is given by adding an inert element with the comparatively large atomic radius to modify or densify the surface (including a side surface) for preventing the intrusion of moisture or oxygen. Thereby, reliability of the light emitting device is promoted.

The present invention having the above embodiment is described in more detail later in the following embodiments.

Embodiment 1

Figure 8A:
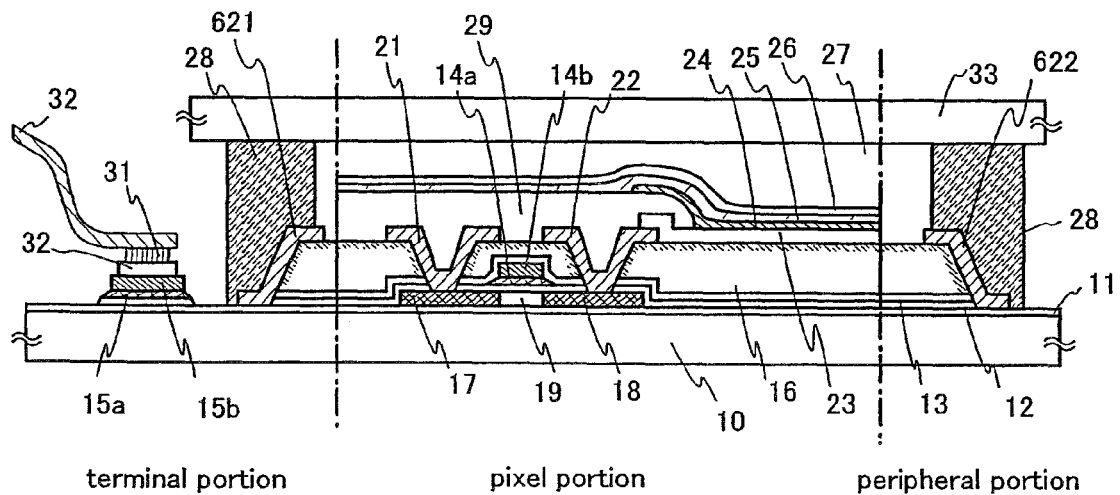
FIGS. 8A and 8B are views showing a sectional and a periphery portion of a light emitting device (Embodiment 1).

In this embodiment, an example of an edge portion covered with a metal layer is described with reference to FIGS. 8A and 8B. Portions other than a peripheral portion are identical with those in FIG. 2A shown in Embodiment Mode; therefore, detailed description is omitted here. Note that the same reference numerals are used in FIGS. 8A and 8B for the same parts as those in FIG. 2A.

Metal layers 621 and 622 are formed by covering a circumference of a high thermostability planarizing film. The metal layers 621 and 622 may be formed simultaneously with source/drain electrodes 21 and 22, or may be separately formed by patterning. However, a part of a lead wiring to be connected to a terminal electrode is not covered with the metal layers 621 and 622, although not shown here.

Figure 8B:
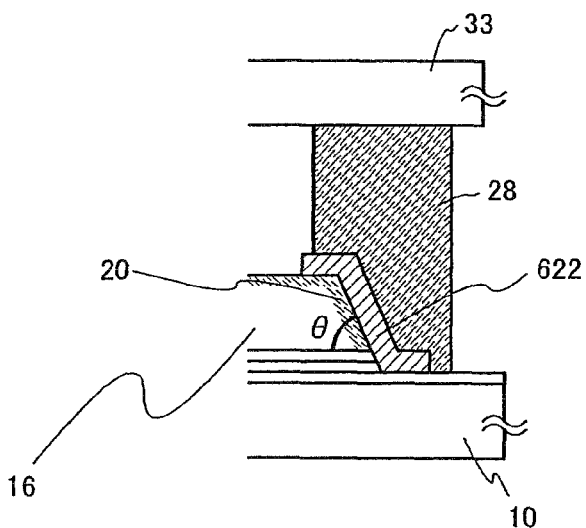

FIG. 8B shows an enlarged cross-sectional view of an peripheral portion. A side surface of an edge portion having a step in the high thermostability planarizing film 16 is covered with the metal layers 621 and 622. Coverage is favorable since the edge portion has a tapered shape. Further, adhesiveness with the metal layer is also favorable since an inert element is added to a surface of the thermostability planarizing film 16 and a highly densified portion 20 is formed.

In this embodiment, intrusion of moisture or the like can be further prevented by covering a side surface of an edge portion added with an inert element and having a tapered shape with the metal layers 621 and 622.

This embodiment can be freely combined with Embodiment Mode.

Embodiment 2

In this embodiment, an example of an edge portion added with an inert element by plasma treatment is described with reference to FIG. 9. Portions other than the edge portion are identical with those in FIG. 2B shown in Embodiment Mode; therefore, detailed description is omitted here. Note that the same reference numerals are used in FIG. 9 for the same parts as those in FIG. 2B.

This embodiment is an example of forming a highly densified portion on a surface (including a side surface) by adding an inert element without forming an edge portion of a high thermostability planarizing film 16 into a tapered shape.

In this embodiment, an edge portion of the high thermostability planarizing film 16 is nearly perpendicular, and has curvature in a top edge portion thereof.

Figure 9:
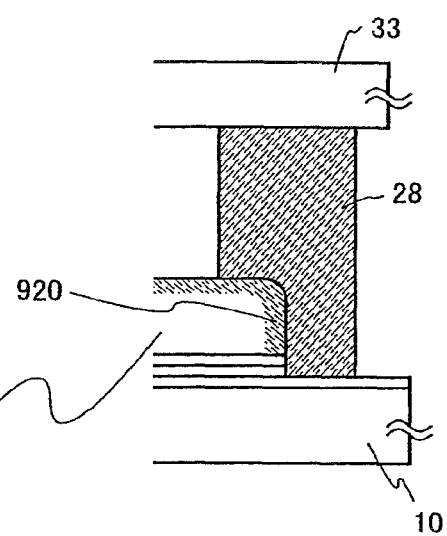
FIG. 9 is a view showing an enlarged illustration of a periphery portion (Embodiment 2).

The highly densified portion can be provided on a surface (including a side surface) by a method for adding an inert element with plasma treatment even if an edge portion has such a shape as shown in FIG. 9.

According to this embodiment, a sealing structure that effectively prevents intrusion of moisture or the like can be achieved without performing etching for forming a tapered shape.

This embodiment can be freely combined with Embodiment Mode or Embodiment 1.

Embodiment 3

Figure 10A:
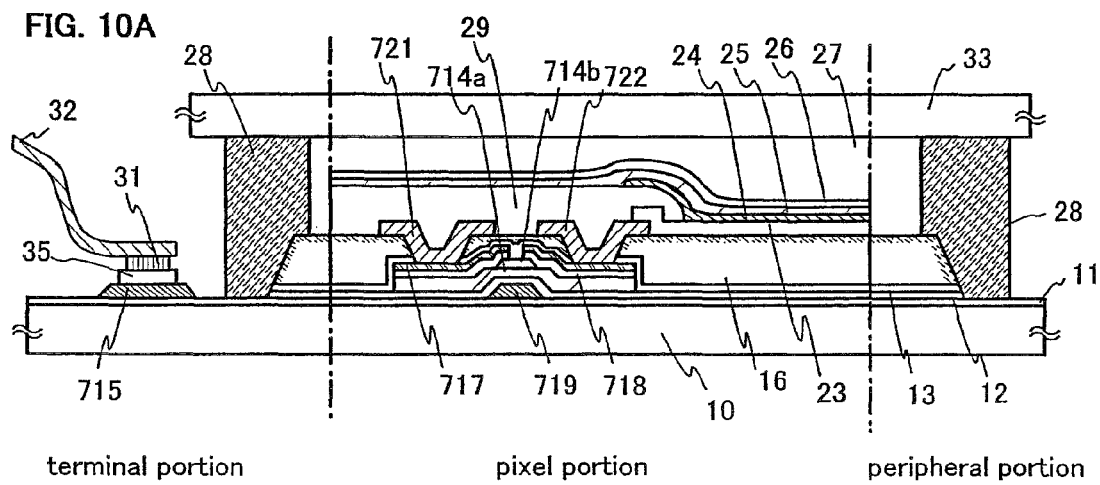
FIGS. 10A and 10B are views showing cross sectionals of a light emitting device (Embodiment 3).
Figure 10B:
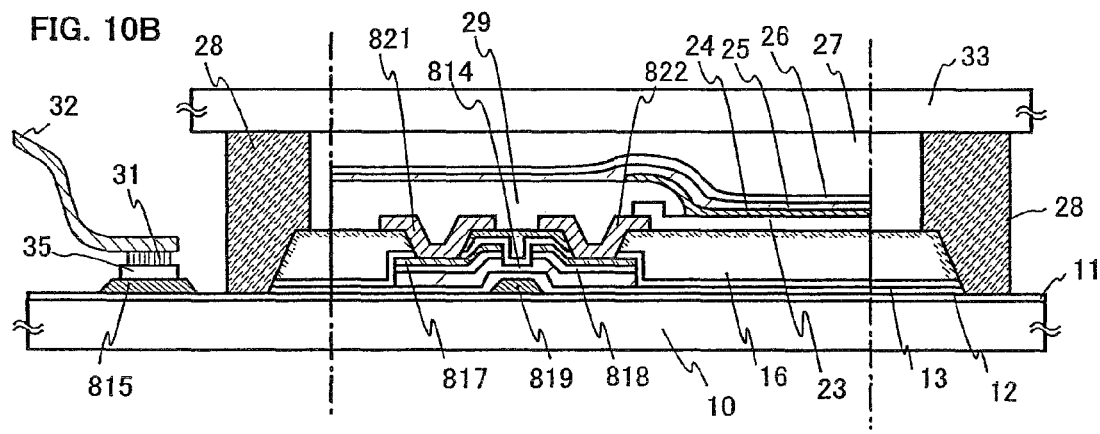

An example of an inversely staggered TFT is described in this embodiment with reference to FIGS. 10A and 10B. Portions other than a TFT and a terminal electrode are identical with those in FIG. 2A shown in Embodiment Mode; therefore, detailed description is omitted here. Note that the same reference numerals as those in FIG. 2A are used in FIGS. 10A and 10B for the same parts as those in FIG. 2A.

A TFT shown in FIG. 10A is a channel stop type. A gate electrode 719 and a terminal electrode 715 are simultaneously formed, and a semiconductor layer containing an amorphous semiconductor film 714a, an n+ layer 718, and a metal layer 717 are laminated over a gate insulating film 12. A channel stopper 714b is formed over a portion to be a channel formation region of the semiconductor layer 714a. Further, source/drain electrodes 721 and 722 are formed.

A TFT shown in FIG. 10B is a channel etch type. A gate electrode 819 and a terminal electrode 815 are simultaneously formed, and a semiconductor layer containing an amorphous semiconductor film 814, an n+ layer 818, and a metal layer 817 are laminated over a gate insulating film 12. A portion to be a channel formation region of the semiconductor layer 814 is thinly etched. Further, source/drain electrodes 821 and 822 are formed.

A semi-amorphous semiconductor film (referred to also as a microcrystal semiconductor film) which has an intermediate structure between an amorphous structure and a crystalline structure (including single crystal and poly crystal) and has a third condition being stable in terms of free energy and includes a crystalline region having short-distance order and lattice distortion can also be used in place of the amorphous semiconductor film. As a method for manufacturing a semi-amorphous semiconductor film, glow discharge decomposition (plasma CVD) of a silicide gas is performed. As a silicide gas, $SiH_4$, or in addition, $Si_2H_6$, $SiH_2Cl_2$, $SiHCl_3$, $SiCl_4$, $SiF_4$, or the like can be used. The silicide gas may be diluted with $H_2$, or $H_2$ and one or more kinds of rare gas elements: He, Ar, Kr, and Ne. Dilution ratio is within the range from 2 times to 1000 times. Pressure is roughly within the range from 0.1 Pa to 133 Pa; power supply frequency, from 1 MHz to 120 MHz, preferably from 13 MHz to 60 MHz; and a substrate heating temperature, at most 300° C., preferably from 100° C. to 250° C. An atmospheric constituent impurity such as oxygen, nitrogen, or carbon as an impurity element within a film is preferably at most $1\times10^{20}$ atom/cm$^{-3}$, and particularly, oxygen concentration is at most $5\times10^{19}$ atoms/cm$^3$, preferably at most $1\times10^{19}$ atoms/cm$^3$. Note that electric field-effect mobility μ of a TFT using a semi-amorphous semiconductor film as an active layer is from 1 cm$^2$/Vsec to 10 cm$^2$/Vsec.

This embodiment can be freely combined with Embodiment Mode, Embodiment 1, or Embodiment 2.

Embodiment 4

Figure 11:
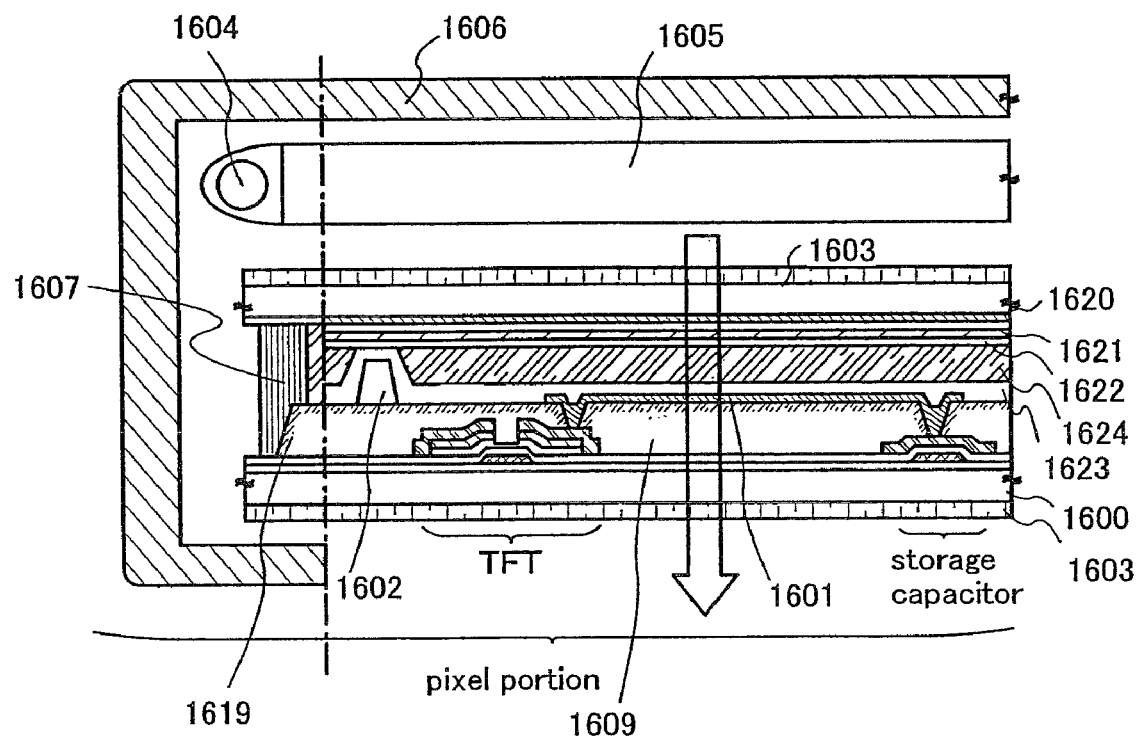
FIG. 11 is a view showing an active matrix liquid crystal display device (Embodiment 4).

In this embodiment, an example of an active matrix liquid crystal display device is described with reference to FIG. 11.

An example of manufacturing steps is described hereinafter.

First, an active matrix substrate is formed by using a light transmitting substrate 600. A large-sized substrate having a size of, for example, 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm is preferably used; therefore, the manufacturing cost is reduced. A glass substrate containing barium borosilicate glass, aluminoborosilicate glass, or the like, as typified by #7059 glass or #1737 glass produced by Corning Inc. can be used as a substrate that can be used. In addition, a light transmitting substrate such as a quartz substrate or a plastic substrate can be alternatively used.

After a conductive layer is formed entirely over the substrate 600 having an insulating surface by sputtering, a first photolithography step is performed to form a resist mask. An unnecessary part of the resist mask is etched away, thereby forming a wiring and an electrode (a gate electrode, a storage capacitor wiring, a terminal, and the like). Note that a base insulating film is formed over the substrate 600, if necessary.

An element of Ti, Ta, W, Mo, Cr, or Nd, an alloy containing the elements as its component, or a nitride containing the elements as its component may be used as a material of the wiring and the electrode. Further, a laminate including a plurality of layers each including a substance selected from elements of Ti, Ta, Ta, W, Mo, Cr, and Nd, an alloy containing the elements as its component, or a nitride containing the elements as its component.

When a screen size is enlarged, the length of each wiring is increased. A problem of high wiring resistance occurs and the power consumption is increased. Accordingly, the wiring and the electrode may contain a material of Cu, Al, Ag, Au, Cr, Fe, Ni, or Pt, or an alloy thereof to lower the wiring resistance and to achieve the low power consumption. Further, the wiring and the electrode may be formed with ink jet by using liquid in which ultrafine particles (grain diameter from 5 nm to 10 nm) of metal such as Ag, Au, Cu, or Pd are separately dispersed in high concentration without being aggregated.

Subsequently, a gate insulating film is entirely formed by PCVD. The gate insulating film is formed by laminating a silicon nitride film and a silicon oxide film to have a thickness from 50 nm to 200 nm, preferably 150 nm. Note that the gate insulating film is not limited to a laminate, and an insulating film such as a silicon oxide film, a silicon nitride film, a silicon oxynitride film, a tantalum oxide film, or the like can be used alternatively.

Next, a first amorphous semiconductor film is formed entirely over the gate insulating film by a known method such as plasma CVD or sputtering to have a thickness from 50 nm to 200 nm, preferably from 100 nm to 150 nm. Typically, an amorphous silicon (a-Si) film is formed to have a thickness of 100 nm. When the film is formed over a large-sized substrate, the chamber is also enlarged; therefore, more treating time for evacuating the chamber and a large amount of film formation gas are required. Thus, further cost reduction may be realized by forming the amorphous silicon (a-Si) film by using a linear plasma CVD apparatus under the atmospheric pressure.

Thereafter, a second amorphous semiconductor film including an impurity element imparting one conductivity type (n-type conductivity or p-type conductivity) is formed to have a thickness from 20 nm to 80 nm. The second amorphous semiconductor film including an impurity element imparting one conductivity type (n-type conductivity or p-type conductivity) is entirely formed by a known method such as plasma CVD or sputtering. In this embodiment, the second amorphous semiconductor film including an n-type impurity element is formed by sputtering using a silicon target added with phosphorus.

Next, a resist mask is formed by a second photolithography step, and an unnecessary portion is etched away, thereby forming a first island-shaped amorphous semiconductor film and a second island-shaped amorphous semiconductor film. As a method for etching on this occasion, wet etching or dry etching is carried out.

After a conductive layer covering the second island-shaped amorphous semiconductor film is formed by sputtering, a third photolithography step is performed to form a resist mask. An unnecessary portion is etched away, thereby forming a wiring and an electrode (a source wiring, a drain electrode, a storage capacitor electrode, and the like). An element of Al, Ti, Ta W, Mo, Cr, Nd, Cu, Ag, Au, Fe, Ni, or Pt, or an alloy containing the elements as its component may be used as a material of the wiring and the electrode. Further, the wiring and the electrode may be formed with ink jet by using liquid in which ultrafine particles (grain diameter from 5 nm to 10 nm) of metal such as Ag, Au, Cu, or Pd are separately dispersed in high concentration without being aggregated. When the wiring and the electrode are formed by ink jet, the photolithography step is unnecessary, so that further cost reduction can be achieved.

Subsequently, a resist mask is formed by a fourth photolithography step, and a source wiring, a drain electrode, and a capacitor electrode are formed by etching an unnecessary portion away. As a method for etching on this occasion, wet etching or dry etching is carried out. A storage capacitor having an insulating film containing the same material as that of the gate insulating film as a dielectric is formed. A part of the second amorphous semiconductor film is removed in a self-alignment manner by using the source wiring and the drain electrode as masks, and further, a part of the first amorphous semiconductor film is thinned. The thinned area serves as a channel formation region of a TFT.

A protective film (not shown) containing a silicon nitride film with a thickness of 150 nm and a high thermostability planarizing film 1609 with a thickness of 1 μm are entirely formed by plasma CVD. The high thermostability planarizing film 1609 is baked after applying a liquid raw material called varnish in which a low molecular weight ingredient (a precursor) having the combination of silicon (Si) and oxygen (O) is dissolved into a solvent over the substrate by spin coat or ink jet. The high thermostability planarizing film 1609 has higher light transmittance than acryl, and is suitable for an interlayer insulating film of a liquid crystal display device.

Subsequently, the high thermostability planarizing film 1609 in a circumference is removed at the same time of forming a contact hole in the high thermostability planarizing film 1609.

Thereafter, doping treatment using an inert element is performed to form a highly densified portion 1619 over a surface of the high thermostability planarizing film 1609. As a doping treatment, ion doping or ion implantation is carried out. Typically, argon (Ar) is used as the impurity element. Distortion is given by adding the inert element with the comparatively large atomic radius to modify a surface (including a side surface) or to highly densify for preventing the intrusion of moisture or oxygen; therefore, deterioration of a liquid crystal is prevented.

Then, a channel etch TFT is manufactured by hydrogenation.

Note that a channel etch type is described as an example of a TFT structure in this embodiment; however, the structure is not limited thereto. Any one of the structures of a channel stopper TFT, a top gate TFT, and a staggered TFT may be employed.

Next, a transparent electrode film that contains ITO (indium tin oxide), an indium oxide—zinc oxide alloy ($In_2O_3$—ZnO), or zinc oxide (ZnO) is formed to be 110 nm thick. Thereafter, a pixel electrode 1601 is formed by a photolithography step and an etching step.

Thus, an active matrix substrate including a source wiring, an inversely staggered TFT and a storage capacitor in a pixel portion, and a terminal portion can be manufactured.

Rubbing treatment is performed after an alignment film 1623 is formed over the active matrix substrate. In this embodiment, a columnar spacer 1602 for maintaining a gap between substrates is formed in a desired position by patterning an organic resin film such as an acrylic resin film. Further, spherical spacers may be scattered all over the substrate in place of the columnar spacer.

Subsequently, a counter substrate is prepared. The counter substrate is provided with a color filter 1620 in which colored layers and light shielding layers are disposed correspondingly to each pixel. A planarizing film is provided to cover the color filter and the light shielding layer. Subsequently, a counter electrode 1621 made of a transparent conductive film is formed over the planarizing film to overlap the pixel portion. An alignment film 1622 is formed entirely adjacent to the counter substrate, and then, rubbing treatment is performed.

After a sealant is drawn to surround the pixel portion of the active matrix substrate, liquid crystal is discharged onto the region surrounded with the sealant under reduced pressure by a liquid crystal dispenser device. Thereafter, the active matrix substrate and the counter substrate are attached to each other with a sealant 1607 under reduced pressure, without being exposed to atmospheric air. The two substrates are sealed by being attached to each other so that the sealant 1607 covers an edge portion (tapered portion) of the high thermostability planarizing film 1609. The sealant 1607 is mixed with a filler (not shown). The two substrates are attached to each other with the filler and the columnar spacer 1602 so that the substrates have a uniform interval. By employing a method for dropping a liquid crystal, the amount of liquid crystal used in a manufacturing process can be reduced, and particularly, the cost can be considerably reduced when a large-seized substrate is used.

Thus, an active matrix liquid crystal display device is completed. If necessary, the active matrix substrate or the counter substrate is cut into a desired shape. Further, an optical film such as a polarizing plate 1603 or a color filter is appropriately provided using a known technique. An FPC is further attached to the substrate by using a known technique.

An active matrix liquid crystal display device (transmissive type) is completed by providing a liquid crystal module obtained according to the above steps with a backlight 1604 and an optical waveguide 1605 and covering the liquid crystal module with a cover 1606. A part of a cross-sectional view of the active matrix liquid crystal display device is shown in FIG. 8B. Note that the cover and the liquid crystal module are fixed with an adhesive or an organic resin. The polarizing plate 1603 is attached to both the active matrix substrate and the opposing substrate, since the liquid crystal display device is a transmissive type.

Further, an example of the transmissive type is described in this embodiment; however, the liquid crystal display device is not limited thereto, and a reflective or semi-transparent liquid crystal display device can be manufactured. In the case of obtaining a reflective liquid crystal display device, a metal film with high optical reflectance, typically, a film containing aluminum or silver as its main component, a laminate thereof, or the like may be used for a pixel electrode.

This embodiment can be freely combined with Embodiment Mode.

Embodiment 5

In this embodiment, examples of electronic devices equipped with a display portion are described with reference to FIGS. 12A to 12G and FIG. 13. An electronic device having a liquid crystal display device or a light emitting device can be completed by applying the present invention.

Examples of electronic devices are as follows: a video camera; a digital camera; a goggle type display (head mounted display); a navigating system; an audio reproducing device (car audio, an audio component, or the like); a laptop personal computer; a game machine; a personal digital assistant (a mobile computer, a cellular phone, a portable game machine, an electronic book, or the like); and an image reproducing device including a recording medium (specifically, a device capable of processing data in a recording medium such as a Digital Versatile Disk (DVD) and having a display that can display the image of the data); and the like.

FIG. 12A is a perspective view of a laptop personal computer, and FIG. 12B is a perspective view thereof in a folded state. The laptop personal computer includes a main body 2201, a casing 2202, display portions 2203a and 2203b, a keyboard 2204, an external connection port 2205, a pointing mouse 2206, and the like. By applying the invention to the display portions 2203a and 2203b, a high thermostability planarizing film of which surface is added with an inert element effectively prevents intrusion of moisture or an impurity from external, and a laptop personal computer with high reliability can be completed.

FIG. 12C shows a television, which includes a casing 2001, a supporting section 2002, a display portion 2003, a video input terminal 2005, and the like. The television includes all television for displaying information, including ones for personal computers, for TV broadcasting reception, and for advertisement. By applying the invention to the display portion 2003, a high thermostability planarizing film of which surface is added with an inert element has high planarity over an entire panel even in a large size. Consequently, a television that indicates a vivid display can be completed.

FIG. 12D shows a portable game machine, which includes a main body 2501, a display portion 2505, an operation switch 2504, and the like. By applying the invention to the display portion 2505, intruding moisture or oxygen that is a cause of deteriorating characteristics of an EL element can be blocked without enlarging the display portion. Accordingly, a portable game machine with high reliability, having a small display portion, can be completed.

FIG. 12E is a perspective view of a cellular phone, and FIG. 12F is a perspective view thereof in a folded state. The cellular phone includes a main body 2701, a casing 2702, display portions 2703*a* and 2703*b*, an audio input portion 2704, an audio output portion 2705, operation keys 2706, an external connection port 2707, an antenna 2708, and the like.

The cellular phone shown in FIGS. 12E and 12F is provided with a high-resolution display portion 2703*a* that mainly displays an image in full color and an area color display portion 2703*b* that mainly displays characters and symbols. By applying the invention to the display portions 2703*a* and 2703*b*, intruding moisture or oxygen that is a cause of deteriorating characteristics of an EL element can be blocked without enlarging the display portion. Accordingly, a cellular phone having a lightweight and small display portion can be completed.

FIG. 12G shows a display board such as an advertisement board, which includes display portion 2801, a casing 2802, a lighting portion 2803 such as LED light, and the like. By applying the invention to the display portion 2801, a display board that indicates a bright display can be completed since a high thermostability planarizing film of which surface is added with an inert element has high light transmittance.

FIG. 13 shows an example of mounting a display portion on an automobile. Here, an automobile is used as a typical example of a vehicle, but the invention is not particularly limited thereto. It goes without saying that the invention can be applied to an aircraft, a train, an electric train, or the like. As for a display device mounted particularly on an automobile, emphasis is put on high reliability even in a severe environment (inside of an automobile which is subject to high temperatures and high humidity).

FIG. 13 shows the vicinity of a driver's seat in an automobile. A dashboard 2301 is provided with audio reproducing devices, specifically a car audio system and a car navigating system. A main body 2401 of the car audio system includes a display portion 2402 and operation switches 2403 and 2404. By applying the invention to the display portion 2402, a high thermostability planarizing film of which surface is added with an inert element effectively prevents intrusion of moisture or an impurity from external. Consequently, a car audio system with high reliability can be completed.

By applying the invention further to a display portion 2300 of the car navigating system, intrusion of moisture or an impurity from external can be effectively prevented. Consequently, a car navigation system with high reliability can be completed.

By applying the invention further to a display portion 2305 displaying an air condition state in an automobile, intrusion of moisture or an impurity from external can be effectively prevented. Consequently, a car navigation system with high reliability can be completed.

Further, in the vicinity of a steering wheel portion 2302, the dashboard 2301 is provided with a display portion 2303 in which a digital display of a measuring instrument such as a speedometer is formed. By applying the invention to the display portion 2303, a high thermostability planarizing film of which surface is added with an inert element effectively prevents intrusion of moisture or an impurity from external. Consequently, a machinery indicator with high reliability can be completed.

Further, an on-board car audio system and a car navigation system are described in this embodiment; however, the invention may be applied to other vehicle indicators and to stationary audio and navigating systems.

A light emitting device or a liquid crystal display device obtained by applying the invention as mentioned above may be used for display portions of various electronic devices. Note that a semiconductor device manufactured by employing any one of structures of Embodiment Mode, and Embodiments 1 to 4 may be used for an electronic device of this embodiment.

A high thermostability planarizing film (typically, an SiOx film including an alkyl group) obtained by application according to the invention prevents intrusion of moisture or oxygen by performing doping using an impurity element to modify or density a surface (including a side surface).

The high thermostability planarizing film according to the invention can be made into an interlayer insulating film durable to reflow treatment in multilayer wirings.

What is claimed is:

1. A semiconductor device, comprising:
   an insulating film formed over a first substrate, wherein an edge portion of the insulating film has a tapered shape;
   a metal layer covering the edge portion;
   a sealant covering the metal layer and the edge portion;
   a second substrate over the sealant, and
   wherein the first substrate and the second substrate are attached with the sealant, and
   wherein the sealant is formed directly on the metal layer.

2. The semiconductor device according to claim 1, wherein the insulating film is a silicon oxide film including an alkyl group.

3. The semiconductor device according to claim 1, wherein a taper angle at the edge portion of the insulating film is more than 30° and less than 75°.

4. A semiconductor device, comprising:
   an insulating film formed over a first substrate, wherein an edge portion of the insulating film has a tapered shape and is added with an inert element;
   a metal layer covering the edge portion;
   a sealant covering the metal layer and the edge portion;
   a second substrate over the sealant, and
   wherein the first substrate and the second substrate are attached with the sealant.

5. The semiconductor device according to claim 4, wherein the insulating film is a silicon oxide film including an alkyl group.

6. The semiconductor device according to claim 4, wherein a taper angle at the edge portion of the insulating film is more than 30° and less than 75°.

7. The semiconductor device according to claim 4, wherein the inert element is one selected from the group consisting of He, Ne, Ar, Kr and Xe.

8. A semiconductor device, comprising:
   an insulating film formed over a first substrate, wherein an edge portion of the insulating film has a tapered shape and is added with an inert element;
   a metal layer covering the edge portion;
   a light emitting element formed over the insulating film;
   a sealant covering the metal layer and the edge portion;
   a second substrate over the sealant, the second substrate covering the light emitting element, and
   wherein the first substrate and the second substrate are attached with the sealant.

9. The semiconductor device according to claim 8, wherein the insulating film is a silicon oxide film including an alkyl group.

10. The semiconductor device according to claim 8, wherein a taper angle at the edge portion of the insulating film is more than 30° and less than 75°.

11. The semiconductor device according to claim 8, wherein the inert element is one selected from the group consisting of He, Ne, Ar, Kr and Xe.

* * * * *

UNITED STATES PATENT AND TRADEMARK OFFICE
CERTIFICATE OF CORRECTION

| | |
|---|---|
| PATENT NO. | : 7,960,733 B2 |
| APPLICATION NO. | : 12/251753 |
| DATED | : June 14, 2011 |
| INVENTOR(S) | : Shunpei Yamazaki et al. |

It is certified that error appears in the above-identified patent and that said Letters Patent is hereby corrected as shown below:

At column 9, line 48, "YvO$_4$" should be --YVO$_4$--;

At column 9, line 50, "YvO$_4$" should be --YVO$_4$--;

At column 9, line 53, "YvO$_4$" should be --YVO$_4$--;

At column 13, line 18, "TN" should be --TiN--;

At column 17, line 25, "Coming Inc." should be --Corning Inc.--;

At column 22, line 8, "density" should be --densify--.

Signed and Sealed this
Twenty-second Day of November, 2011

David J. Kappos
*Director of the United States Patent and Trademark Office*